United States Patent [19]

Maeda

[11] Patent Number: 5,568,408
[45] Date of Patent: Oct. 22, 1996

[54] AUTOMATIC REPAIR DATA EDITING SYSTEM ASSOCIATED WITH REPAIRING SYSTEM FOR SEMICONDUCTOR INTEGRATED CIRCUIT DEVICE

[75] Inventor: Tetsunori Maeda, Tokyo, Japan

[73] Assignee: NEC Corporation, Tokyo, Japan

[21] Appl. No.: 339,683

[22] Filed: Nov. 14, 1994

[30] Foreign Application Priority Data

Nov. 22, 1993 [JP] Japan .................................. 5-315988

[51] Int. Cl.⁶ ................................................. G05B 19/00
[52] U.S. Cl. .......................... 364/580; 364/552; 364/468
[58] Field of Search ..................................... 364/580, 468, 364/552; 324/765, 158.1, 73.1; 437/7, 8; 250/492.2; 148/DIG. 162

[56]  References Cited

U.S. PATENT DOCUMENTS

| | | | |
|---|---|---|---|
| 5,103,557 | 4/1992 | Leedy | 437/8 |
| 5,210,041 | 5/1993 | Kobayashi et al. | 437/8 |
| 5,219,765 | 6/1993 | Yoshida et al. | 437/8 |
| 5,240,866 | 8/1993 | Friedman et al. | 437/8 |
| 5,355,320 | 10/1994 | Erjavic et al. | 364/468 |
| 5,408,405 | 4/1995 | Mozumder et al. | 364/468 |

FOREIGN PATENT DOCUMENTS

| | | |
|---|---|---|
| 0339286 | 11/1989 | European Pat. Off. . |
| 2052446 | 2/1990 | Japan . |
| 2208949 | 8/1990 | Japan . |
| 2206715 | 1/1989 | United Kingdom . |

*Primary Examiner*—Emanuel T. Voeltz
*Assistant Examiner*—Hal D. Wachsman
*Attorney, Agent, or Firm*—Whitham, Curtis, Whitham & McGinn

[57]  ABSTRACT

An automatic repair data editing system is associated with a repairing system for rescuing defective semiconductor memories fabricated on semiconductor wafers from rejection. The system edits repair data that is partially duplicated due to a trouble in the repairing system, and allows the repairing system to automatically carry out a repair work on the defective semiconductor memories.

16 Claims, 18 Drawing Sheets

| DATE | TITLE | |
|---|---|---|
| WAFER NUMBER OF 1st. S.C. WAFER | REPAIR DATA OF 1st. S.C. WAFER | STATEMENT |
| WAFER NUMBER OF 2nd. S.C. WAFER | REPAIR DATA OF 2nd. S.C. WAFER | STATEMENT |
| WAFER NUMBER OF 3rd. S.C. WAFER | REPAIR DATA OF 3rd. S.C. WAFER | STATEMENT |
| WAFER NUMBER OF ith S.C. WAFER | REPAIR DATA OF ith S.C. WAFER | STATEMENT |
| WAFER NUMBER OF LAST S.C. WAFER | REPAIR DATA OF LAST S.C. WAFER | STATEMENT |

Fig. 4
PRIOR ART

| DATA TITLE | | |
|---|---|---|
| WAFER NUMBER OF 1st.S.C.WAFER | REPAIR DATA OF 1st.S.C.WAFER | STATEMENT |
| WAFER NUMBER OF 2nd.S.C. WAFER | REPAIR DATA OF 2nd.S.C. WAFER | STATEMENT |
| WAFER NUMBER OF 3rd.S.C.WAFER | REPAIR DATA OF 3rd. S.C. WAFER | STATEMENT |
| WAFER NUMBER OF 4th S.C. WAFER | REPAIR DATA OF 4th S.C. WAFER | STATEMENT |
| WAFER NUMBER OF 5th S.C. WAFER | REPAIR DATA OF 5th S.C. WAFER | STATEMENT |
| DATA TITLE | | |
| WAFER NUMBER OF 3rd. S.C. WAFER | REPAIR DATA OF 3rd. S.C. WAFER | STATEMENT |
| WAFER NUMBER OF 4th.S.C. WAFER | REPAIR DATA OF 4th S.C. WAFER | STATEMENT |
| WAFER NUMBER OF 5th S.C.WAFER | REPAIR DATA OF 5th S.C. WAFER | STATEMENT |
| WAFER NUMBER OF 6th S.C.WAFER | REPAIR DATA OF 6th S.C. WAFER | STATEMENT |
| WAFER NUMBER OF 7th S.C. WAFER | REPAIR DATA OF 7th S.C. WAFER | STATEMENT |

Fig. 6
PRIOR ART

AUTOMATIC REPAIR DATA EDITING SYSTEM ASSOCIATED WITH REPAIRING SYSTEM FOR SEMICONDUCTOR INTEGRATED CIRCUIT DEVICE

FIELD OF THE INVENTION

This invention relates to an inspection of a semiconductor integrated circuit device and, more particularly, to a repair data editing system for automatically editing repair data used in rescuing defective products from rejection.

DESCRIPTION OF THE RELATED ART

A typical example of an ultra large scale integration is a semiconductor memory device, and the memory capacity of the semiconductor memory device has been progressively increased through miniaturization of the circuit components. However, the miniaturized circuit components are liable to be damaged by crystal defects left in the semiconductor wafer, and a product with a damaged circuit component is diagnosed as a defective product through inspections before delivery to a customer. If the manufacturer rejects all of the defective products, the production yield becomes low, and the customers may complain of high price.

For this reason, the manufacturer tries to rescue the defective products from being rejected. One of the rescuing techniques is to previously prepare redundant memory cells. If a defective memory cell is found in a test sequence, the defective memory cells are replaced with the redundant memory cells, and the redundant memory cells serve as parts of the memory cell array instead of the defective memory cells. The replacement is usually carried out by memorizing the addresses of the defective memory cells. In the rescued product, the redundant memory cells are coupled to a data buffer upon coincidence between the address of an accessed memory cell and one of the internally stored addresses. The internally stored addresses are non-volatile, and are usually memorized by selectively breaking fuse elements with a laser beam before packaging. The rescued products are checked to see whether or not the defective memory cells are perfectly replaced with the redundant memory cells through a test sequence again.

Thus, the testing sequence, the laser trimming and the post-trimming test sequence are required for the rescue. FIG. 1 illustrates the prior art repairing system, and the prior art repairing system largely comprises a host computer 1 accompanied with a terminal 2 and a fixed disk memory unit 3, a test system 4 and a laser trimming system 5. The terminal 2 provides an interface between the host computer 1 and an operator 6, and the host computer 1 communicates with the testing system 4 and the laser trimming system 5 through network cables 7a and 7b. The testing system 4 executes a test program PG for semiconductor memories on wafers WF to determine whether or not each of the semiconductor memories contains a defective memory cell, and supplies repair data or coordinate data indicative of the fuse elements to be broken for storing the addresses of the defective memory cells to the host computer 1. The host computer 1 stores the repair data in the fixed disk unit 3. The host computer 2 thereafter transfers the repair data from the fixed disk unit 3 to the laser trimming system 5, and the laser trimming system 5 selectively breaks fuse elements for storing the addresses in the defective semiconductor memories. The operator can edit the repair data through the terminal 2.

The testing system 4 has a tester 4a accompanied by a local memory unit 4b and a wafer prober 4c accompanied with an automatic handler 4d, and the wafer prober 4c is coupled through control cables 4e to the tester 4a. The semiconductor wafers WF are inserted into a wafer carrier CR as indicated by an arrow AR1, and the wafer carrier CR is attached to the automatic handler 4d as indicated by an arrow AR2. Handling parameters PM are supplied to the automatic handler 4d as indicated by an arrow AR3, and the automatic handler 4d successively supplies the semiconductor wafers WF to the wafer prober 4c in accordance with the handling parameters PM. The probes of the wafer prober 4c are sequentially connected to the pads of the semiconductor memories in the semiconductor wafer WF. The tester 4a executes the test program PG for each of the semiconductor memories, and checks all of the memory cells to see whether or not a defective memory cell is contained. If a defective memory cell is found in one of the semiconductor memories on the semiconductor wafer WF, the tester 4a produces the repair data identifying the defective memory cell, and the repair data is transferred to the host computer.

Upon completion of the test program for one of the semiconductor wafers WF, the automatic handler 4d recovers the semiconductor wafer WF from the wafer prober 4c, and groups the semiconductor wafer WF by the result of the test. The automatic handler 4d supplies a new semiconductor wafer WF to the wafer prober 4c.

The host computer 1 teaches the repair data to the laser trimming system 5, and the laser trimming system 5 selectively breaks the fuse elements incorporated in the defective semiconductor memory for storing the addresses of the defective memory cells.

Thus, the testing system 4 and the laser trimming system 5 cooperate under the control of the host computer 1, and rescue the defective semiconductor memories from rejection.

FIG. 2 illustrates the repetition of the test program for N semiconductor wafers WF retained in the wafer carrier CR. When the operator 6 manipulates a start switch (not shown) of the wafer prober 4c, the automatic handler 4d supplies the first semiconductor wafer WF from the wafer carrier CR to the wafer prober 4c as by step P1, and the tester 4a executes the test program for the first semiconductor wafer WF under the communication with the wafer prober 4c as by step P2. If defective memory cells are found in the first semiconductor wafer, the tester 4a produces the repair data, and the repair data are stored in the fixed disk unit 3. The automatic handler 4d removes the first semiconductor wafer WF from the wafer prober 4c as by step P3, and stores the first semiconductor wafer WF in a group.

Subsequently, the automatic handler 4d supplies the second semiconductor wafer WF to the wafer prober 4c, and the tester 4a executes the test program for the second wafer WF to see whether or not a semiconductor memory contains a defective memory cell as by step P5. The tester 4a produces repair data for the semiconductor memories of the second semiconductor wafer WF, and the automatic handler 4d removes the second semiconductor wafer WF from the wafer prober 4c upon completion of the test program as by step P6.

Thus, the tester 4a repeats steps P4 to P6 (N−3) times, and produces repair data for these semiconductor wafers in cooperation with the automatic handler 4d and the wafer prober 4c.

Finally, the automatic handler 4d supplies the final semiconductor wafer WF from the wafer carrier CR to the wafer prober 4c as by step P7, and the tester 4a checks the semiconductor memories of the final semiconductor wafer WF to see whether or not a defective memory cell is contained in the semiconductor memories WF as by step P8. Upon completion of the test program, the automatic handler 4d removes the final semiconductor wafer WF from the wafer carrier CR, and the inspection of the N semiconductor wafers WF is completed.

While an ith semiconductor wafer WF is being subjected to the test sequence, the tester 4a step-wise executes instructions forming the test program as shown in FIG. 3, and a repair data file is created through the program sequence shown in FIG. 3 for the semiconductor wafer WF. The tester 4a acquires a piece of first chip information of the first semiconductor memory from the wafer prober 4c as by step P11. The pieces of first chip information is indicative of the first semiconductor memory of the semiconductor wafer WF. If the i semiconductor wafer WF is the first semiconductor wafer WF of the wafer carrier CR, it is necessary to newly create a repair data file, and the answer to step P12 is given affirmative. Then, the tester 4a creates a repair data file as by step P13, and the tester 4a writes a data title in the repair data file as by step P14. However, if the ith semiconductor wafer WF is one of the second semiconductor wafer WF to the last semiconductor wafer WF, the tester 4a jumps to step P15 without execution of steps P13 and P14. At step P15, the wafer number i is written.

Subsequently, the tester 4a starts the test sequence to see whether or not a defective memory cell is contained in the first semiconductor memory on the ith semiconductor wafer WF as by step P16. The tester 4a acquires repair data for the first semiconductor memory, if necessary, and writes the repair data in the repair data file as by step P17.

The tester 4a repeats the check and the acquisition of repair data for other semiconductor memories on the ith semiconductor wafer WF. If j semiconductor memories are fabricated on the i semiconductor wafer WF, the tester 4a repeats the check and the acquisition (j–2) times after step P17.

The tester 4a finally checks the last semiconductor memory to see whether or not a defective memory cell is contained as by step P18. The tester 4a acquires repair data, if necessary, and writes the repair data in the repair data file for the last semiconductor memory as by step P19.

When the tester 4a completes the test on the ith semiconductor wafer WF, the tester 4a acquires a wafer end signal indicative of the completion of the test on the last semiconductor memory from the wafer prober 4c as by step P20, and a statement for the completion of the test is written in the repair data file as by step P21.

The tester 4a checks the ith semiconductor wafer WF to see whether it is the last semiconductor wafer in the wafer carrier CR or not as by step P22. If the answer is given negative, the tester 4a returns to the program sequence shown in FIG. 2. On the other hand, if the answer is given affirmative, the tester 4a acquires a lot end signal indicative of the completion of the test on all the semiconductor wafers WF in the wafer carrier CR from the wafer prober 4c as by step P23, and closes the repair data file as by step P24.

In order to accelerate the test, the local memory 4b is provided for the tester 4a, and the tester 4a transfers the repair data file to the host computer 1 in response to the wafer end signal and the lot end signal. The host computer 1 in turn transfers the repair data file to the fixed disk unit 3, and the repair data file is stored in the fixed disk unit 3.

If the first to last semiconductor wafers WF retained in the wafer carrier CR are examined without a trouble, the repair data file is organized as shown in FIG. 4. First, the data title is written, and memory areas are successively assigned to the first to last semiconductor wafers WF. Namely, the wafer number is firstly written, the repair data follow, and the statement for the completion is provided at the end of the memory area. In this instance, the memory areas are arranged in order of tested wafers WF. However, another repair data file may be inversely arranged.

Thus, the repair data are written in the repair data file in an orderly way insofar as the test sequence is completed without trouble. However, if trouble takes place, the test sequence is interrupted, and the test system 4 restarts the test sequence as shown in FIG. 5. In the test sequence shown in FIG. 5, the wafer carrier CR is assumed to retain seven semiconductor wafers WF, and a trouble take place upon determination of the repair data for the fifth semiconductor wafer WF. The test system 4 repeats the test sequence for the first to fifth semiconductor wafers WF, and produces repair data. When the trouble takes place after the completion of the repair data for the fifth semiconductor wafer WF, the test system 4 immediately makes an emergency stop, and the operator 6 troubleshoots.

When the trouble is removed, the test system 4 restarts the test sequence with the third semiconductor wafer WF, because some semiconductor wafers WF may be affected by the trouble. The test system 4 repeats the test sequence for the third to the seventh semiconductor wafers WF, and terminates the test upon completion of the repair data for the seventh semiconductor wafer WF.

As a result, the repair data file is organized as shown in FIG. 6, and the repair data for the third to fifth semiconductor wafers WF are doubled. The repair data file is transferred from the tester 4a to the host computer 1, and is stored in the fixed disk unit 3 in their original condition.

The semiconductor wafers WF already checked by the test system 4 are transferred to the laser trimming system 5, and the host computer transfers the repair data from the fixed disk unit 3 to the laser trimming system 5. The laser trimming system 5 radiates a laser beam to the fuse elements indicated by the repair data or the coordinate data, and the addresses of the defective memory cells are stored in the defective semiconductor memories. This results in rescue of the defective memories from rejection.

The repair data transferred from the fixed disk unit are valid insofar as a trouble does not make parts of the repair data double. However, the doubled repair data misleads the laser trimming system 5. In order to prevent the laser trimming system 5 from being misled, the operator is expected to edit out the doubled repair data in the file through the terminal 2.

A sampling test also requests the editing work to the operator 6. An operator' samples a semiconductor wafer WF in the wafer carrier CR, and inspects the sampled semiconductor wafer WF. After the inspection, the operator returns the semiconductor wafer WF to the wafer carrier CR. However, the sampled semiconductor wafer WF is not returned to the originally retained position in the wafer carrier CR at all times, and the operator is expected to edit out and in the repair data of the sampled semiconductor wafer WF.

If the statement of the completion is not correctly written after the repair data, the laser trimming system 5 mistakenly breaks fuse elements. The operator 6 is expected to correctly edit the statement.

Thus, the editing work is necessary between the test and the laser trimming. However, the operator can not exactly edit the repair data at all times. If the operator makes a mistake in the editing work, the laser trimming system 5 produces non-recoverable defective memories, and the production yield becomes miserable.

SUMMARY OF THE INVENTION

It is therefore an important object of the present invention to provide an automatic repair data editing system which exactly edit repair data without instructions of an operator.

To accomplish the object, the present invention proposes to automatically edit repair data in accordance with a historical file listing semiconductor wafers subjected to a test.

In accordance with the present invention, there is provided an automatic repair data editing system associated with a repairing system for rescuing a semiconductor integrated circuit fabricated on each of semiconductor wafers from a rejection through a test sequence and a repairing sequence, comprising: a historical data producing means operative to create a historical file listing pieces of first identity data indicative of the semiconductor wafers successively subjected to the test sequence in an orderly way; a repair data producing means operative to carry out the test sequence for each of the semiconductor integrated circuits fabricated on the semiconductor wafers and to produce pieces of repair data for rescuing defective semiconductor integrated circuits contained in the semiconductor integrated circuits, the pieces of repair data being respectively accompanied with pieces of second identity data indicative of the semiconductor wafers successively subjected to the test sequence; and an editing means operative to compare the pieces of second identity data with the pieces of first identity data to see whether or not the pieces of repair data are arranged in the same order as the semiconductor wafers successively subjected to the test sequence for exactly editing the pieces of repair data, thereby allowing the defective semiconductor integrated circuits to be automatically repaired through the repairing sequence in accordance with said repair data edited by the editing means.

BRIEF DESCRIPTION OF THE DRAWINGS

The features and advantages of the automatic repair data editing system according to the present invention will be more clearly understood from the following description taken in conjunction with the accompanying drawings in which:

FIG. 4 is a view showing the organization of the repair data file created by the prior art repairing system without trouble;

FIG. 6 is a view showing the organization of the repair data file created under the trouble;

DESCRIPTION OF THE PREFERRED EMBODIMENTS

First Embodiment

Figure 1:
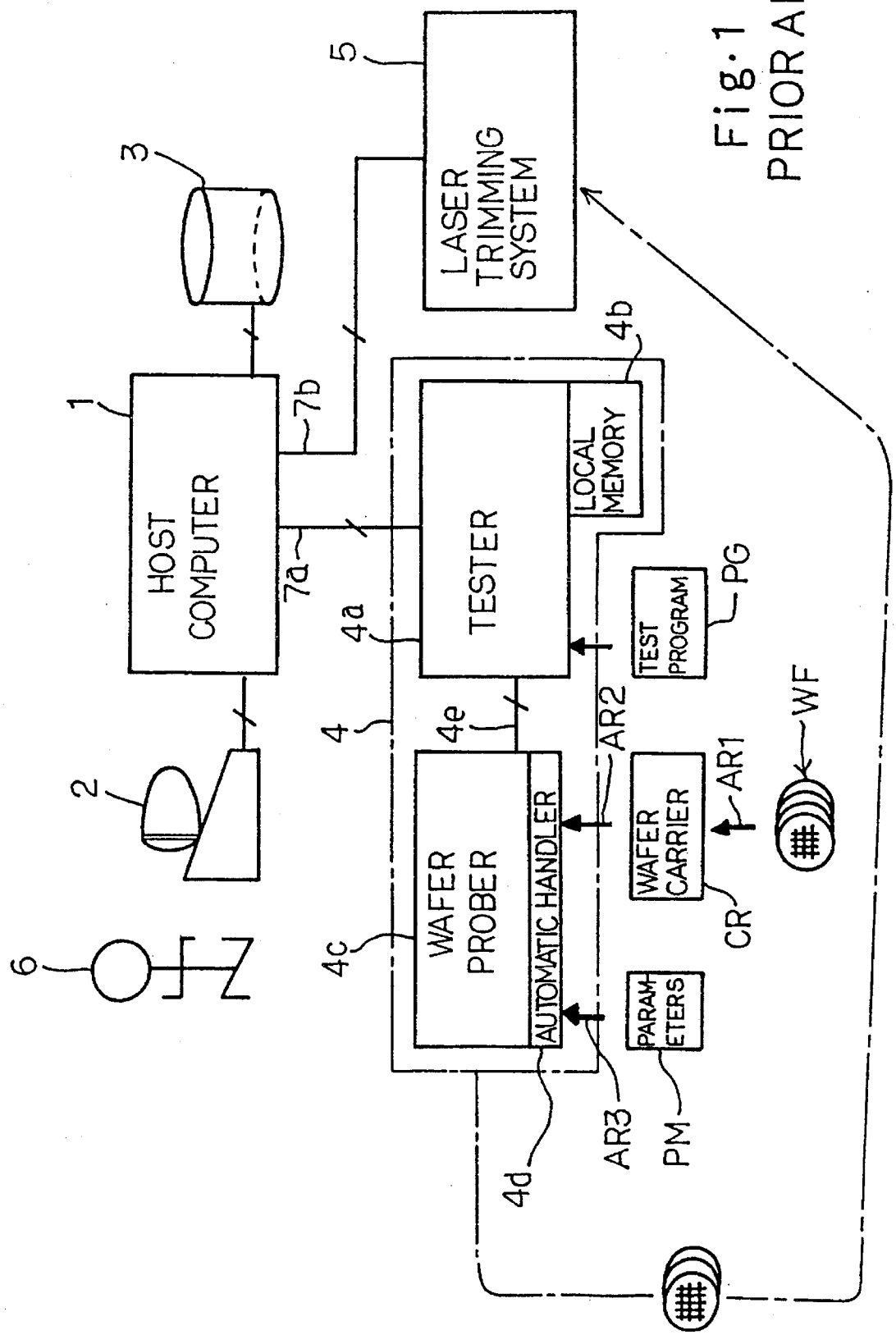
FIG. 1 is a schematic view showing the prior art repairing system for the semiconductor memory devices.
Figure 2:
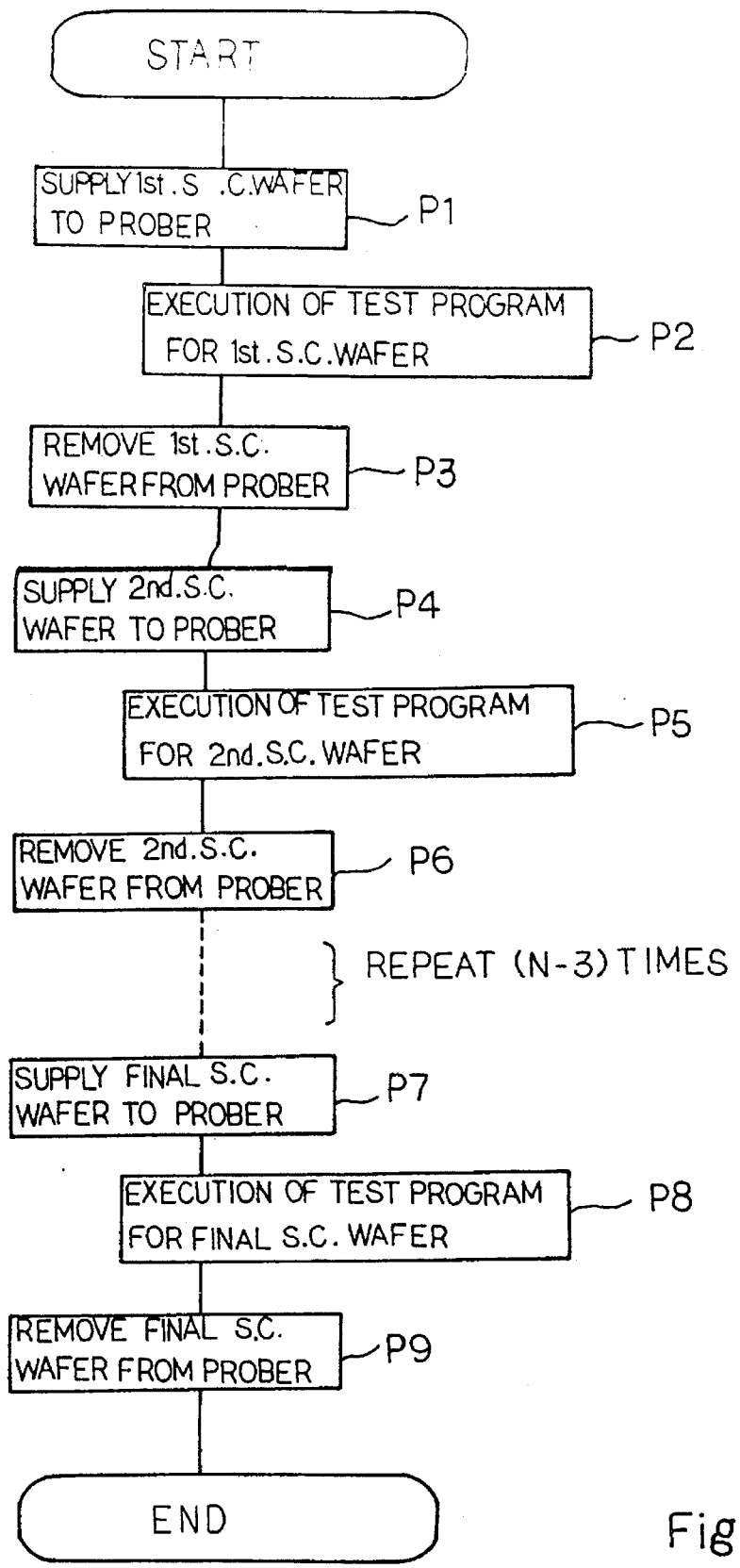
FIG. 2 is a flow chart showing the test sequence for the semiconductor wafers retained in the wafer carrier carried out by the prior art repairing system without a trouble.
Figure 3:
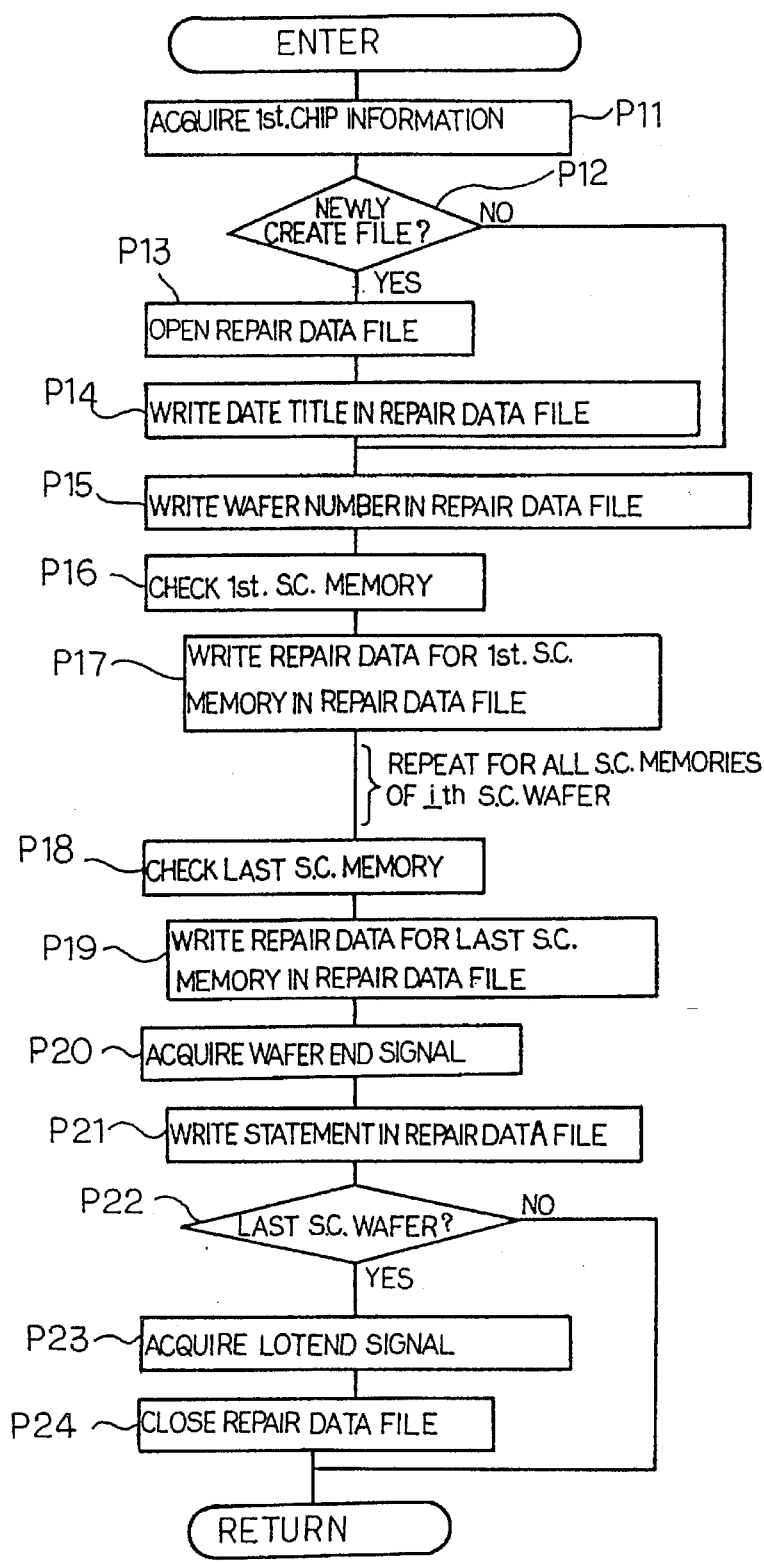
FIG. 3 is a flow chart showing the test sequence executed by the tester incorporated in the prior art repairing system.
Figure 5:
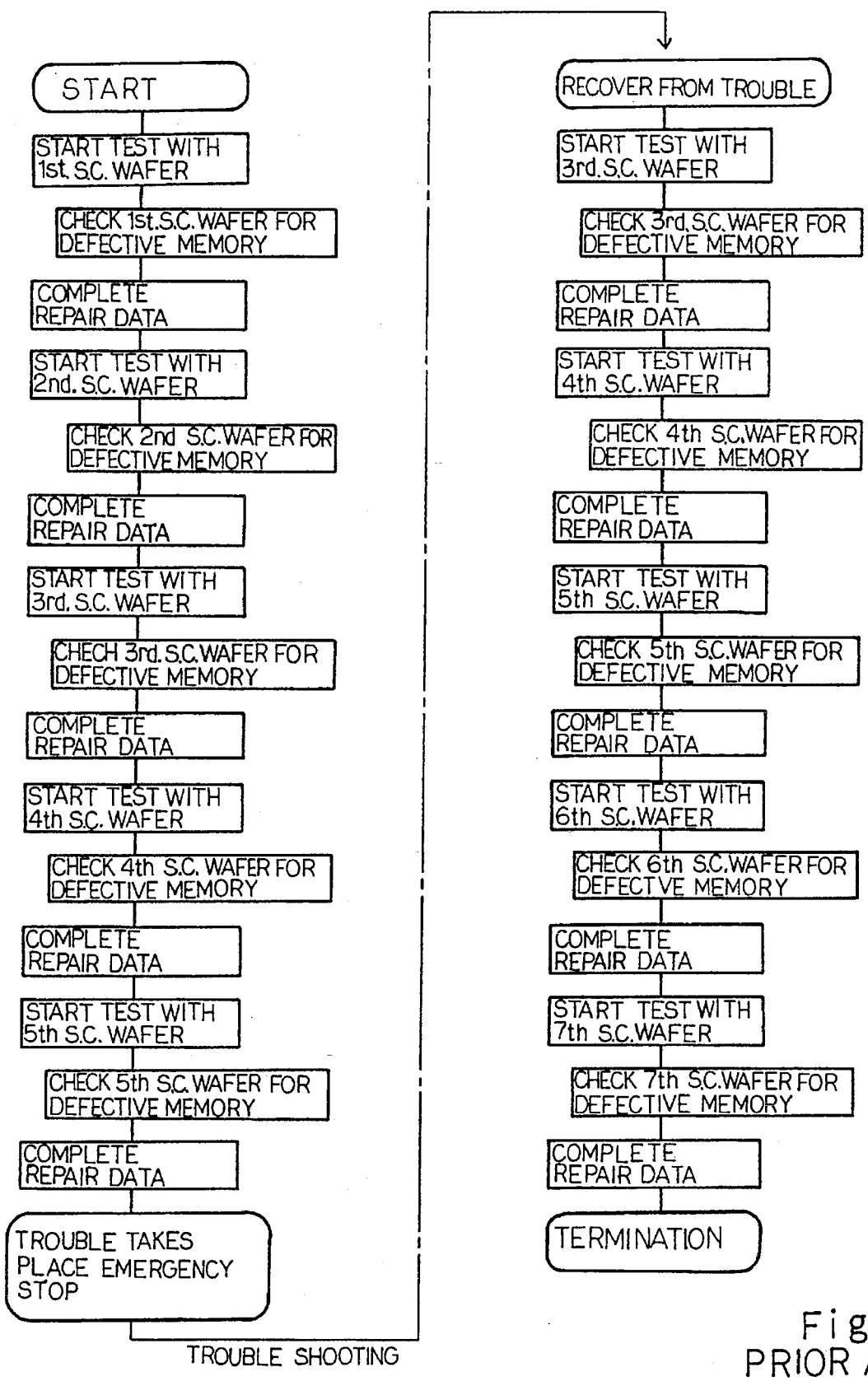
FIG. 5 is a flow chart showing the test sequence carried out by the prior art repairing system and interrupted by trouble.
Figure 7:
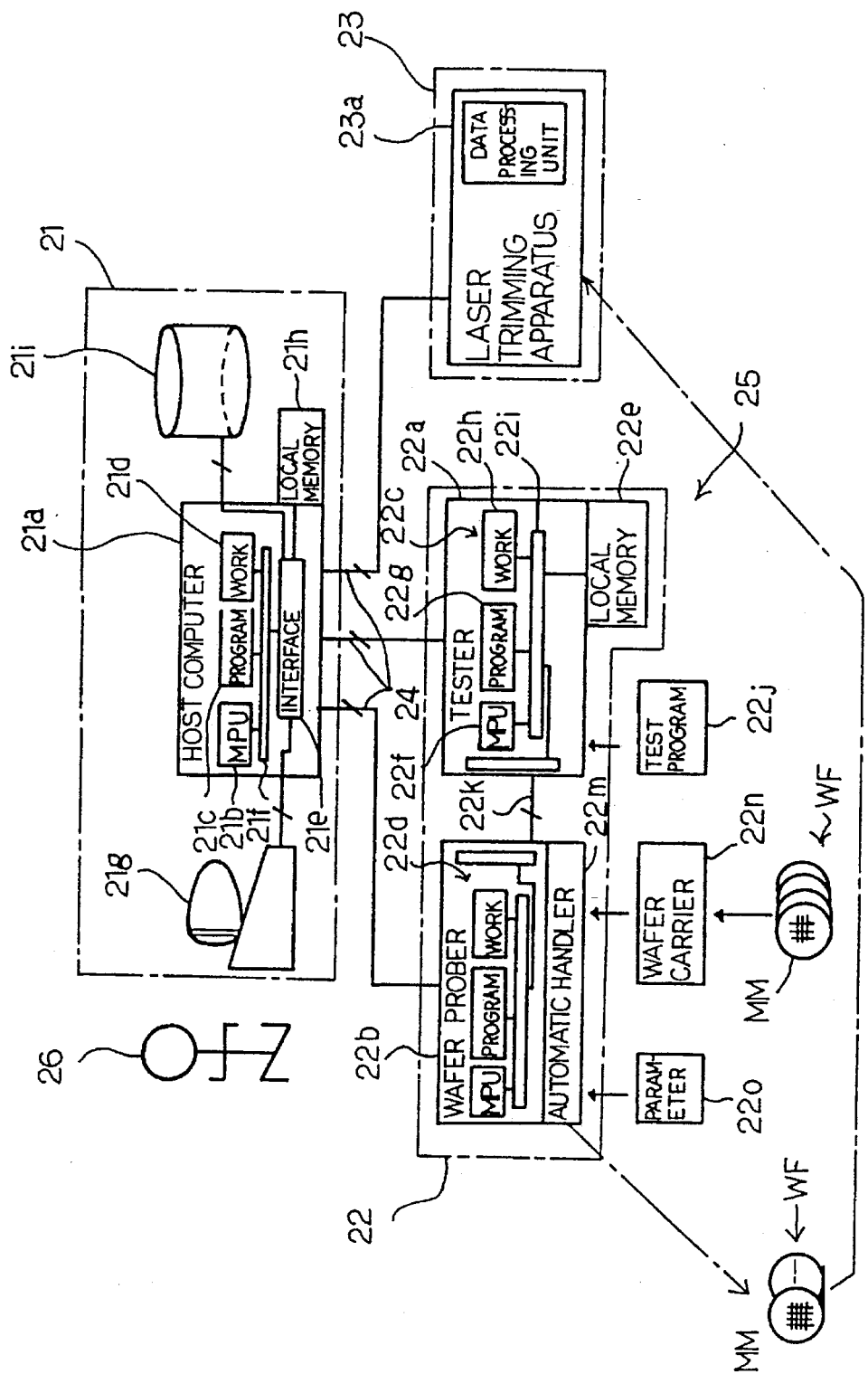
FIG. 7 is a schematic view showing a repairing system equipped with an automatic repair data editing system according to the present invention.

Referring to FIG. 7 of the drawings, a repairing system embodying the present invention largely comprises a host computer sub-system 21, a testing sub-system 22, a laser trimming sub-system 23 and a cable network 24 coupled between the host computer sub-system 21, the testing sub-system 22 and the laser trimming sub-system 23, and the testing sub-system 22 which is broken down into a tester 22a and a wafer prober 22b. Data processing units 22c and 22d are respectively incorporated in the tester 22a and the wafer prober 22b, and the data processing units 22c and 22d, the host computer sub-system 21 and the cable network 24 form an automatic editing system 25 together with program sequences described hereinlater.

The host computer system 21 comprises a computer unit 21a having a microprocessor 21b, a program memory 21c, a working memory 21d and an interface 21e coupled to a bus system 21f, a terminal 21g coupled to the computer unit 21a, a local memory 21h coupled to the computer unit 21a and a fixed disk unit 21i also coupled to the computer unit 2ia. The microprocessor 21b executes program sequences stored in the program memory 21c, and controls the testing sub-system 22 and the laser trimming sub-system 23.

The data processing unit 22c of the tester 22a is accompanied by a local memory 22e, and has a microprocessor 22f, a program memory 22g, a working memory 22h and a bus system 22i. The data processing unit 22c reads a test program from a program source 22j, and a pattern generator (not shown) produces various test pattern under the control of the data processing unit 22c. The test patterns and necessary control signals such as address signals are supplied from the tester 22a through communication cables 22k to the wafer prober 22b, and the wafer prober 22b sequentially applies the test patterns and the necessary control signals to semiconductor memories MM fabricated on a semiconductor wafer WF. The data processing unit 22c further executes program sequences for analyzing results reported from the wafer prober 22b, producing repair data indicative of coordinates of fuse elements to be broken for storing addresses of defective memory cells and creating a repair data file in the local memory 22e.

The wafer prober 22b comprises not only the data processing unit 22d but also an automatic handler 22m and probe unit (not shown). A wafer carrier 22n retaining semiconductor wafers WF is loaded to the automatic handler 22m, and the automatic handler 22m sequentially supplies, evacuates and groups the semiconductor wafers WF under the control of the data processing unit is 22d. The probe unit sequentially brought into contact with pads of the semiconductor memories of each of the semiconductor wafers WF, and applies the test patterns and the necessary control signals to each of the semiconductor memories. The output signals of each semiconductor memory are transferred through the communication cables 22k to the tester 22a as the results under the control of the data processing unit 22d.

Thus, the data processing unit 22d further executes a program sequence for creating a historical file, and the semiconductor wafers WF subjected to the test are listed in the historical file.

The laser trimming sub-system 23 also has a data processing unit 23a and a laser radiating unit. The data processing unit 23a controls the laser radiating unit on the basis of the repair data indicative of the coordinates of the fuse elements to be broken for storing the addresses of the defective memory cells in each defective memory on each semiconductor wafer WF.

The repairing system according to the present invention behaves as follows. When an operator 26 instructs the repairing system to start a test sequence for the semiconductor wafers WF retained in the wafer carrier 22n, the host computer sub-system 21 starts the test sub-system 22 to sequentially diagnose the semiconductor wafers WF for generating repair data, and, thereafter, the laser trimming sub-system 23 repairs defective semiconductor memories through replacement of defective memory cells with redundant memory cells.

Figure 8A:
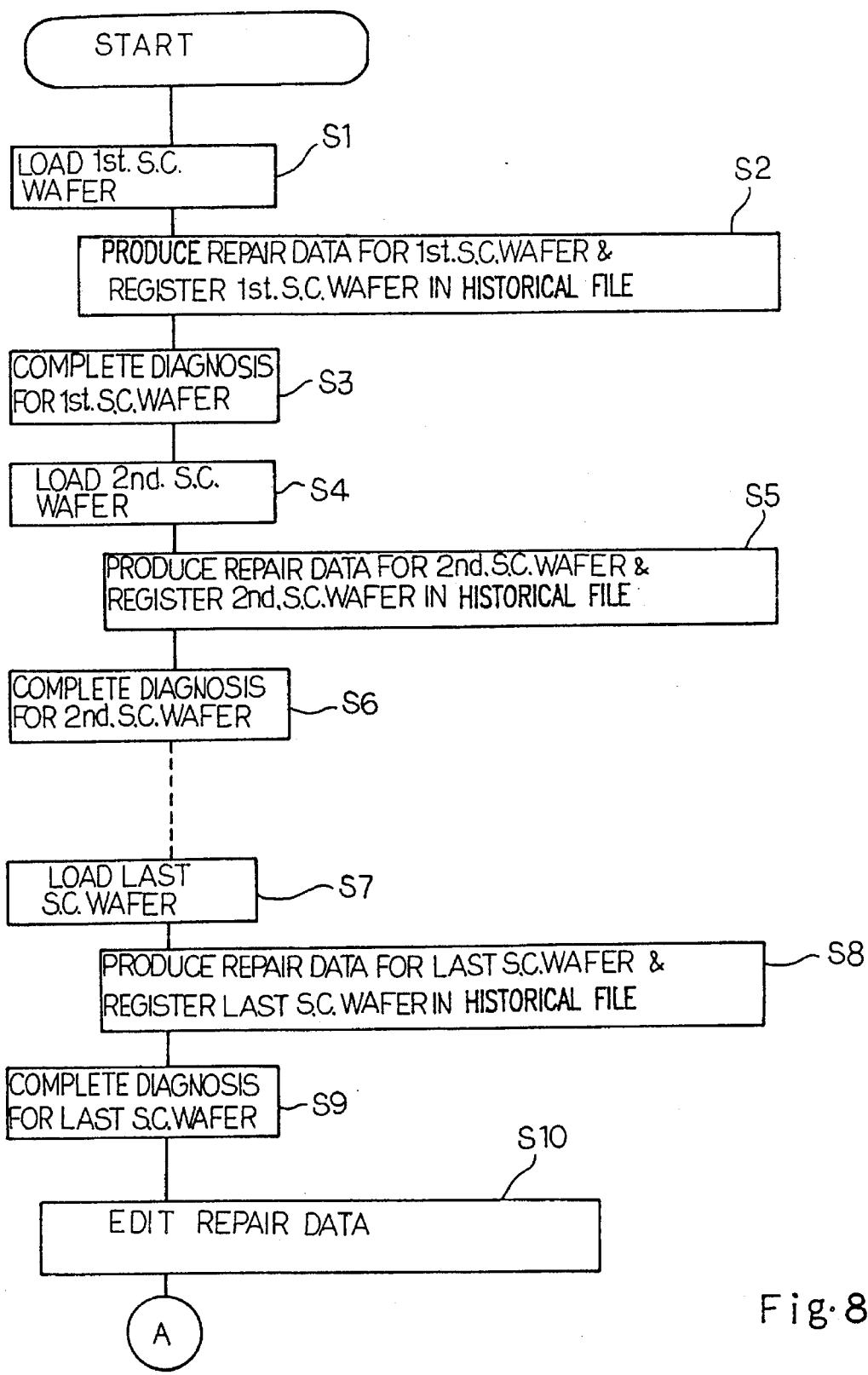
FIG. 8A and 8B are flow charts showing test and repair sequences executed by the repairing system.
Figure 8B:
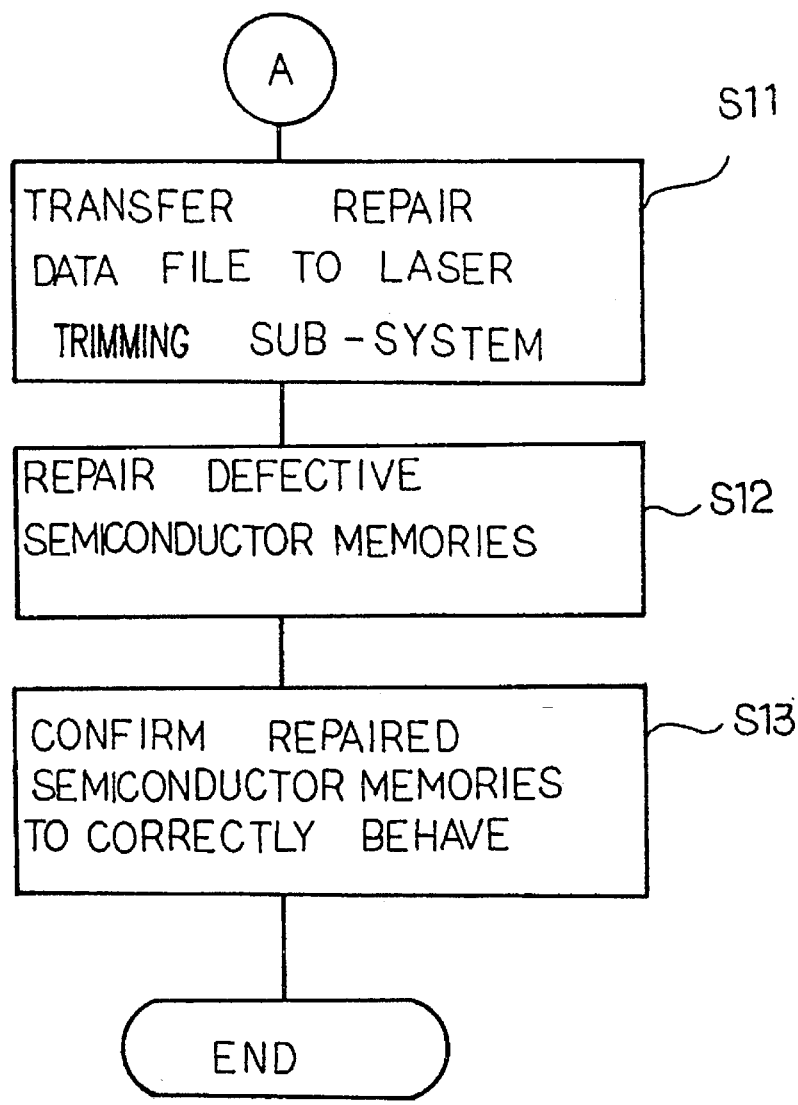

If trouble does not take place, the test sub-system 22 sequentially diagnoses the semiconductor wafers WF without any duplication, and repair data are successively arranged in a repair data file also without a duplication as shown in FIGS. 8A and 8B. In the drawings, the word "semiconductor" is abbreviated as "S.C.".

First, the automatic handler 22m supplies the first semiconductor wafer WF to the probe unit as by step S1, and the tester 22a checks the semiconductor memories MM on the first semiconductor wafers WF to see whether or not a defective memory cell is found in any of the semiconductor memories MM in cooperation with the wafer prober 22b. The data processing unit 22d registers the wafer number of the first semiconductor wafer WF in the historical file, and the data processing unit 22c produces repair data indicative of coordinates of fuse elements to be broken as by step S2. The repair data is stored in a repair data file together with the wafer number. When a statement is written in the repair data file for indicating completion of the diagnose on the first semiconductor wafer WF, the test sequence for the first semiconductor wafer WF is completed as by step S3. In this instance, the wafer number written in the historical file and the wafer number written in the repair data file serve as a piece of first identity data and a piece of second identify data, respectively.

Subsequently, the automatic handler 22m supplies the second semiconductor wafer WF to the probe unit as by step S4, and the tester 22a checks the semiconductor memories MM on the second semiconductor wafers WF to see whether or not a defective memory cell is found in any of the semiconductor memories MM in cooperation with the wafer prober 22b. The data processing unit 22d registers the wafer number of the second semiconductor wafer WF in the historical file, and the data processing unit 22c produces repair data indicative of coordinates of fuse elements to be broken from the test results as by step S5. The repair data is stored in the repair data file together with the wafer number. When the statement is written in the repair data file for indicating completion of the diagnose on the second semiconductor wafer WF, the test sequence for the second semiconductor wafer WF is completed as by step S6.

The steps S4 to S6 are repeated by the test sub-system for other semiconductor wafers, and the automatic handler 22m finally supplies the last semiconductor wafer WF to the probe unit as by step S7, and the tester 22a checks the semiconductor memories MM on the last semiconductor wafers WF to see whether or not a defective memory cell is found in any of the semiconductor memories MM in cooperation with the wafer prober 22b. The data processing unit 22d registers the wafer number of the last semiconductor wafer WF in the historical file, and the data processing unit 22c produces repair data indicative of coordinates of fuse elements to be broken as by step S8. The repair data is stored in the repair data file together with the wafer number. When the statement is written in the repair data file for indicating completion of the diagnose on the last semiconductor wafer WF, the test sequence for the last semiconductor wafer WF is completed as by step S9.

When all of the semiconductor wafers WF are diagnosed by the test sub-system 22, the data processing units 22c and 22d respectively transfer the repair data file and the historical data file through the cable network 24 to the host computer sub-system 21, and the host computer sub-system 21 edits the repair data in accordance with the historical file as by step S10. After the completion of the editing work, the host computer sub-system 21 transfers the edited repair data file to the laser trimming sub-system 23, and the laser trimming unit (not shown) breaks the fuse elements identified by the repair data in the repair data file under the control of the data processing unit 23a as by step S12. Thus, the defective semiconductor memories MM are rescued through replacement with the redundant memory cells. Finally, the semiconductor wafers WF are checked again to see whether or not the repaired semiconductor memories MM correctly behave as by step S13. After the confirmation, the test/repair sequences are terminated.

Figure 9:
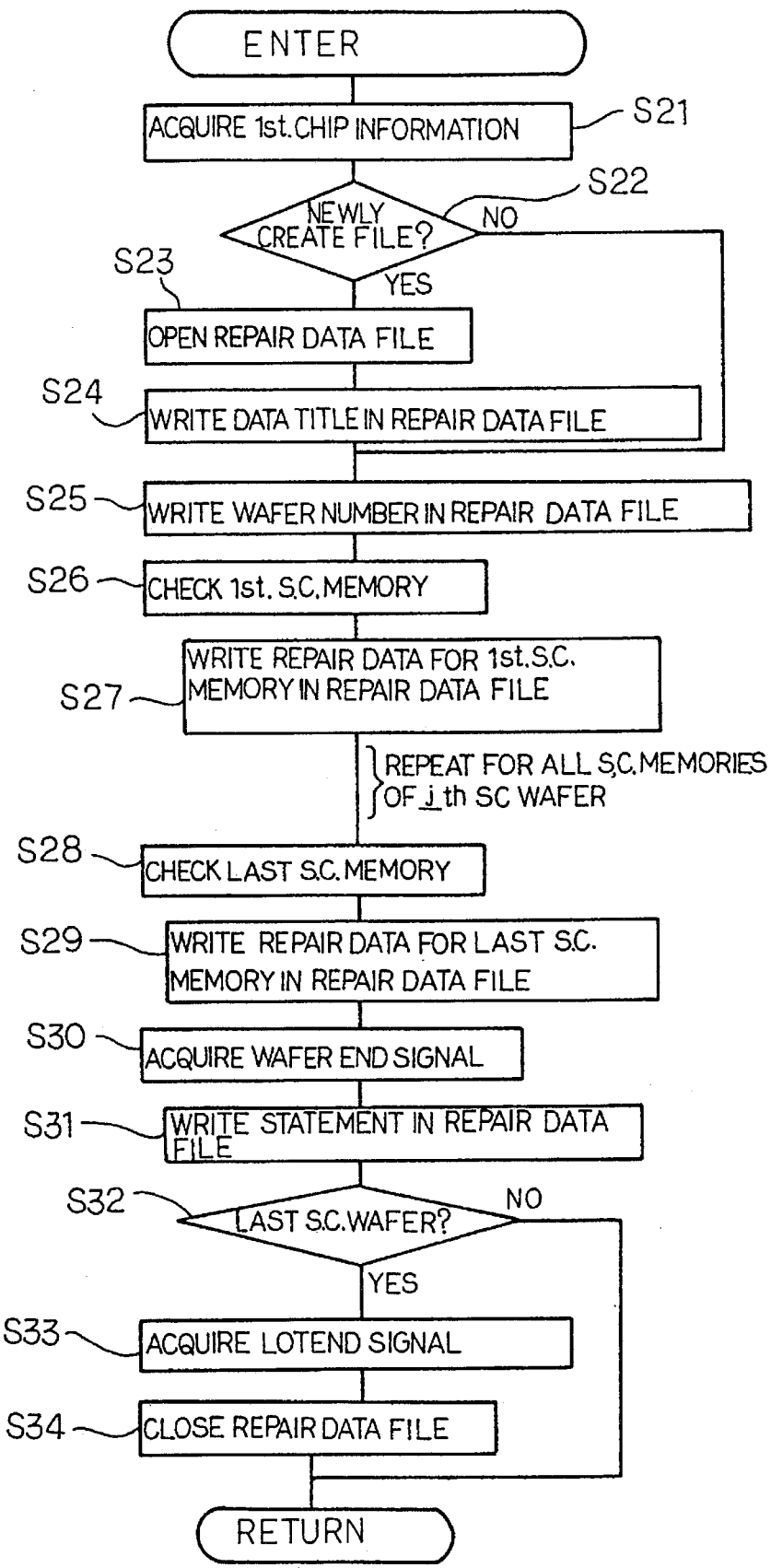
FIG. 9 is a flow chart showing a program sequence executed by a tester incorporated in the repairing system.
Figure 10:
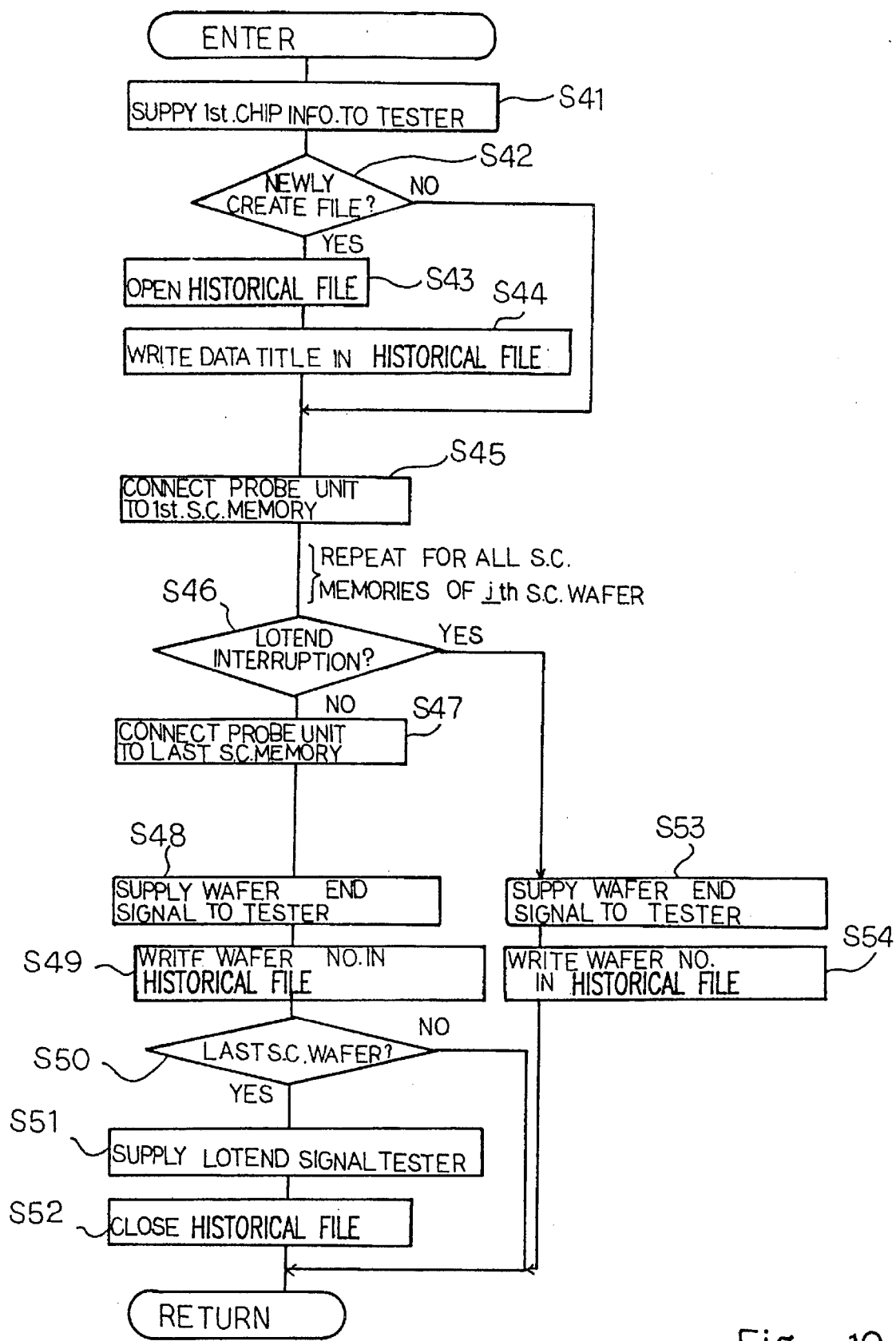
FIG. 10 is a flow chart showing a program sequence executed by a wafer prober incorporated in the repairing system.
Figure 11:
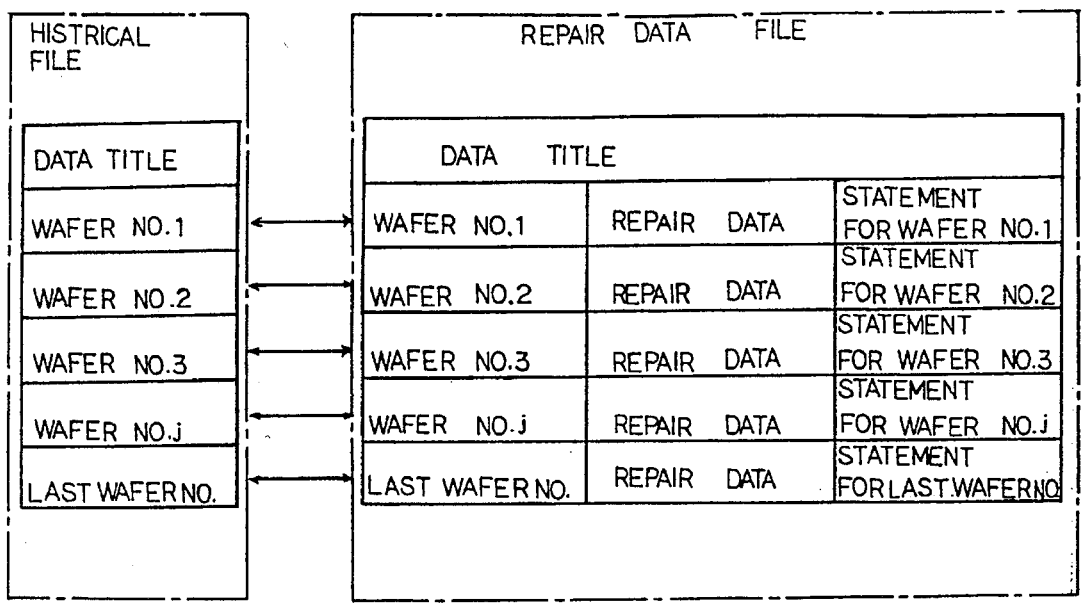
FIG. 11 is a view showing the organization of a repair data file and a historical file created through the program sequences shown in FIGS. 9 and 10.

The data processing units 22c and 22d respectively execute program sequences shown in FIGS. 9 and 10 at each of steps S2, S5 and S8. While a jth semiconductor wafer WF is being loaded to the wafer prober 22b, the data processing unit 22c of the tester 22a acquires a piece of first chip information of the first semiconductor memory MM from the wafer prober 22b as by step S21. The piece of first chip information is indicative of the first semiconductor memory MM of the jth semiconductor wafer WF. If the jth semiconductor wafer WF is the first semiconductor wafer of the wafer carrier, it is necessary to newly create a repair data file, the answer to step S22 is given affirmative. Then, the data processing unit 22c newly creates a repair data file as by step S23, and the data processing unit 22c writes a data title in the repair data file as by step S24. The data title written in the repair data file is illustrated in FIG. 11. However, if jth semiconductor wafer WF are one of the second to last semiconductor wafers WF, the answer to step S22 is given negative, and the data processing unit 22c skips over steps S23 and S24.

The data processing unit 22c writes the wafer number j at step S25 (see FIG. 11). If the jth semiconductor wafer is the first semiconductor wafer WF, the numeral "1" is written immediately after the data title as the identity data. The wafer numbers indicative of the second to last semiconductor wafers WF are thereafter written in an orderly way.

After writing the wafer number, the tester 22a starts the test sequence to see whether or not a defective memory cell is contained in the first semiconductor memory MM of the jth semiconductor wafer WF as by step S26. The data processing unit 22c acquires repair data for the first semiconductor memory MM, if necessary, and writes the repair data in the repair data file as by step S27.

The tester 22a repeats the check and the acquisition of repair data for other semiconductor memories MM of the jth semiconductor wafer WF. If k semiconductor memories are fabricated on the j semiconductor wafer WF, the tester 22a repeats the check and the acquisition (k-2) times after step S27.

The tester 22a finally checks the last semiconductor memory MM to see whether or not a defective memory cell is contained as by step S28. The data processing unit 22c acquires repair data for the last semiconductor memory, if necessary, and writes the repair data in the repair data file as by step S29.

When the tester 22a completes the diagnose on the jth semiconductor wafer WF, the tester 22a acquires a wafer end signal indicative of the completion of the test on the last semiconductor memory from the wafer prober 22b as by step S30, and a statement indicative of the completion of the diagnose is written in the repair data file as by step S31.

The data processing unit 22a checks the jth semiconductor wafer WF to see whether it is the last semiconductor wafer in the wafer carrier 22n or not as by step S32. If the answer is given negative, the data processing unit 22c returns to the program sequence shown in FIGS. 8A and 8B. On the other hand, if the answer is given affirmative, the data processing unit 22c acquires a lot end signal indicative of the completion of the test sequence on all the jth semiconductor wafers WF in the wafer carrier 22n from the wafer prober 22b as by step S33, and closes the repair data file as by step S34. After step S34, the data processing unit 22c returns to the program sequence shown in FIGS. 8A and 8B, and the repair data file is created in the local memory 22e as shown in FIG. 11.

On the other hand, the data processing unit 22d traces the program sequence shown in FIG. 10. First, the data processing unit 22d supplies the first chip information to the tester 22a as by step S41, and determines whether to newly create a historical file or not as by step S42. If the jth semiconductor wafer WF is the first wafer of the wafer carrier 22n, the answer is given affirmative, and the data processing unit 22d creates the new historical file (see FIG. 11) for the set of semiconductor wafers WF in the wafer carrier 22n as by step S43. Thereafter, the data processing unit 22d writes a data title in the historical file. On the other hand, if the jth semiconductor wafer is one of the second to last semiconductor wafers WF in the wafer carrier 22n, the answer to step S42 is given negative, and the data processing unit 22d proceeds to step S45 without execution of steps S43 and S44.

At step S45, the wafer prober 22b connects the probe unit to the first semiconductor memory, and assists the diagnose carried out by the tester 22a. The wafer prober 22b sequentially connects the probe unit to other semiconductor memories of the jth semiconductor wafer WF, and cooperates with the tester 22a.

While the first to last semiconductor wafers WF are being subjected to the diagnose, the data processing unit 22d monitors the probe unit to see whether or not a lot end interruption is requested as by step S46. The lot end interruption is requested upon occurrence of trouble, and the answer to step S46 is given negative in the normal testing sequence.

When the wafer prober 22b connects the probe unit the last semiconductor memory MM of each semiconductor wafer WF except for the last semiconductor wafer WF as by step S47, the data processing unit 22d supplies the wafer end signal to the tester as by step S48, and writes the wafer number in the historical file as by step S49 (see FIG. 11).

The data processing unit 22d checks the jth semiconductor wafer WF to see whether to be the last semiconductor wafer or not as by step S50. While the jth semiconductor wafer WF is not the last wafer in the wafer carrier 22n, the answer is given to the negative, and the data processing unit 22d immediately returns to the program sequence shown in FIGS. 8A and 8B.

On the other hand, if the jth semiconductor wafer WF is the last wafer, the answer to step S50 is given affirmative, and the data processing unit 22d supplies the lot end signal to the tester 22a as by step S51. Finally, the data processing unit 22d closes the historical file, and returns to the program sequence shown in FIGS. 8A and 8B.

If trouble takes place, the answer to step S46 is given affirmative, and the data processing unit 22d supplies the wafer end signal to the tester as by step S53. The data processing unit 22d writes the wafer number in the historical file, and returns to the program sequence as will be described hereinbelow. Typical examples of the trouble are rapid increase of defective semiconductor memories, machine troubles and mis-alignment with a mark on the semiconductor wafer WF.

Thus, the wafer numbers in the historical file are corresponding to the wafer numbers in the repair data file as shown in FIG. 11 insofar as the test sequence is terminated without trouble.

Figure 12A:
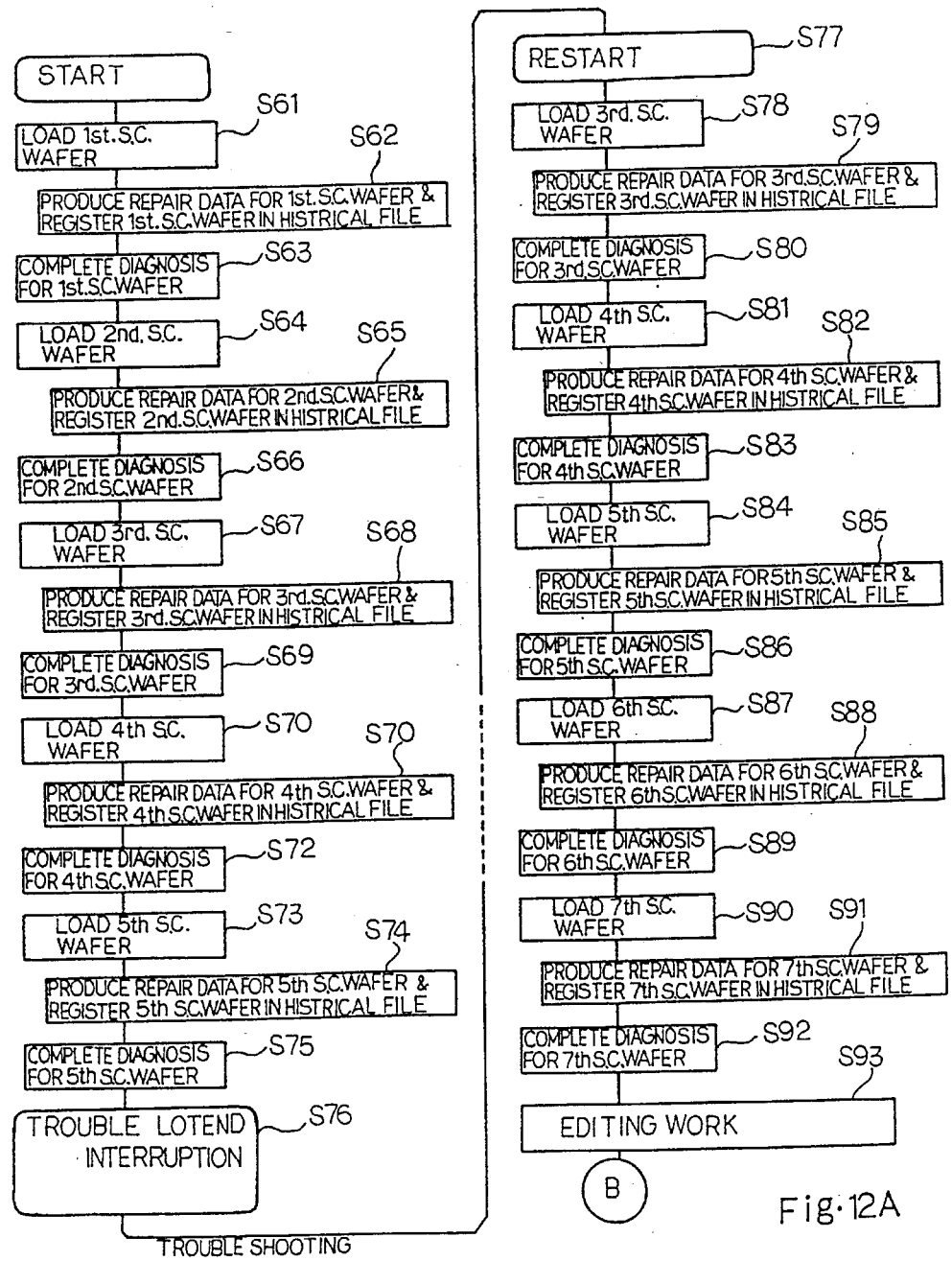
FIGS. 12A and 12B are flowcharts showing a test sequence when trouble takes place.
Figure 12B:
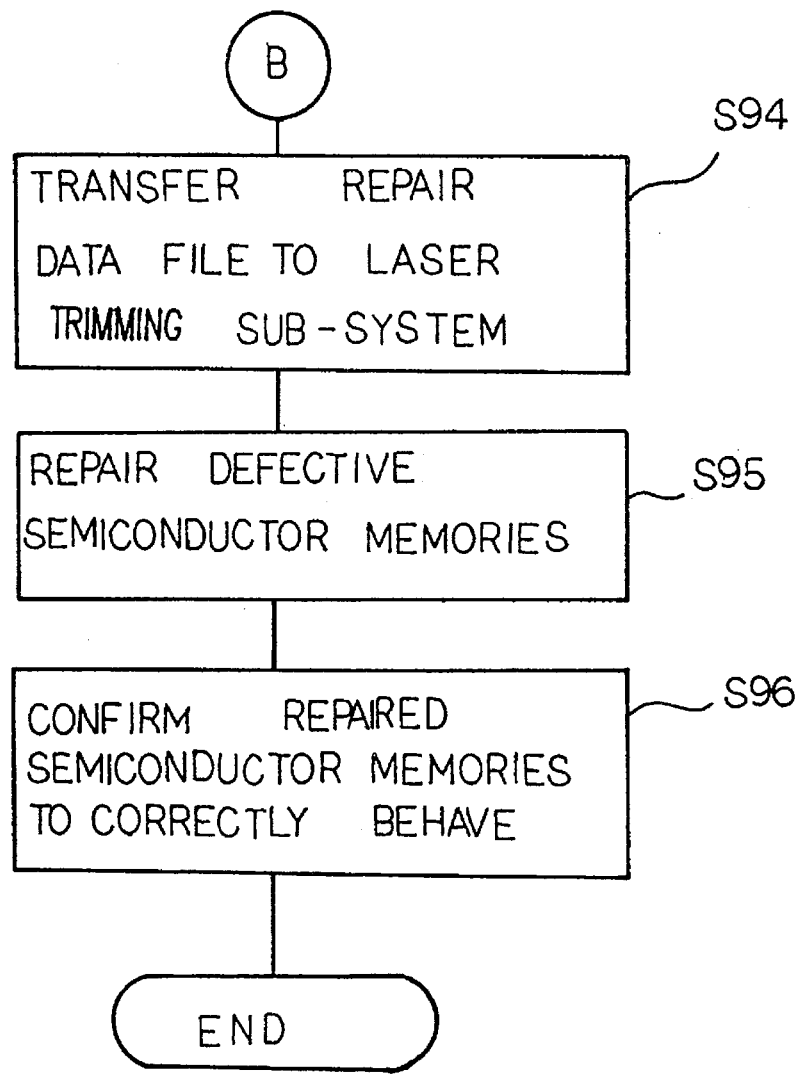

Assuming now that trouble takes place after the test sequence for the fifth semiconductor wafer WF, the repairing system behaves as shown in FIGS. 12A and 12B. When the operator instructs the test and repair works to the repairing system for seven semiconductor wafers retained in the wafer carrier 22n, the host computer sub-system 21 requests the test sub-system 22 to start the test sequence. The automatic handler 22m loads the first semiconductor wafer WF to the probe unit as by step S61, and the tester 22a carries out the test sequence for the first semiconductor wafer WF in cooperation with the wafer prober 22b. The tester 22a stores repair data for the first semiconductor wafer WF in the repair data file, and the wafer prober 22b registers the wafer number of the first semiconductor wafer WF in the historical file as by step S62. The tester 22a adds the statement indicative of the termination of the diagnosis for the first semiconductor wafer WF after the repair data as by step S63.

Subsequently, the automatic handler 22m loads the second semiconductor wafer WF to the probe unit as by step S64, and the tester 22a carries out the test sequence for the second semiconductor wafer WF in cooperation with the wafer prober 22b. The tester 22a stores repair data for the second semiconductor wafer WF in the repair data file, and the wafer prober 22b registers the wafer number of the second semiconductor wafer WF in the historical file as by step S65. The tester 22a finally adds the statement after the repair data as by step S66.

The automatic handler 22m loads the third semiconductor wafer WF to the probe unit as by step S67, and the tester 22a carries out the test sequence for the third semiconductor wafer WF in cooperation with the wafer prober 22b. The tester 22a stores repair data for the third semiconductor wafer WF in the repair data file, and the wafer prober 22b registers the wafer number of the third semiconductor wafer WF in the historical file as by step S68. The tester 22a finally adds the statement after the repair data as by step S69.

After step S69, the automatic handler 22m loads the fourth semiconductor wafer WF to the probe unit as by step S70, and the tester 22a carries out the test sequence for the fourth semiconductor wafer WF in cooperation with the wafer prober 22b. The tester 22a stores repair data for the fourth semiconductor wafer WF in the repair data file, and the wafer prober 22b registers the wafer number of the fourth semiconductor wafer WF in the historical file as by step S71. The tester 22a finally adds the statement after the repair data as by step S72.

Subsequently, the automatic handler 22m loads the fifth semiconductor wafer WF to the probe unit as by step S73, and the tester 22a carries out the test sequence for the fifth semiconductor wafer WF in cooperation with the wafer prober 22b. The tester 22a stores repair data for the fifth semiconductor wafer WF in the repair data file, and the wafer prober 22b registers the wafer number of the fifth semiconductor wafer WF in the historical file as by step S74. The tester 22a finally adds the statement after the repair data as by step S75.

Figure 13:
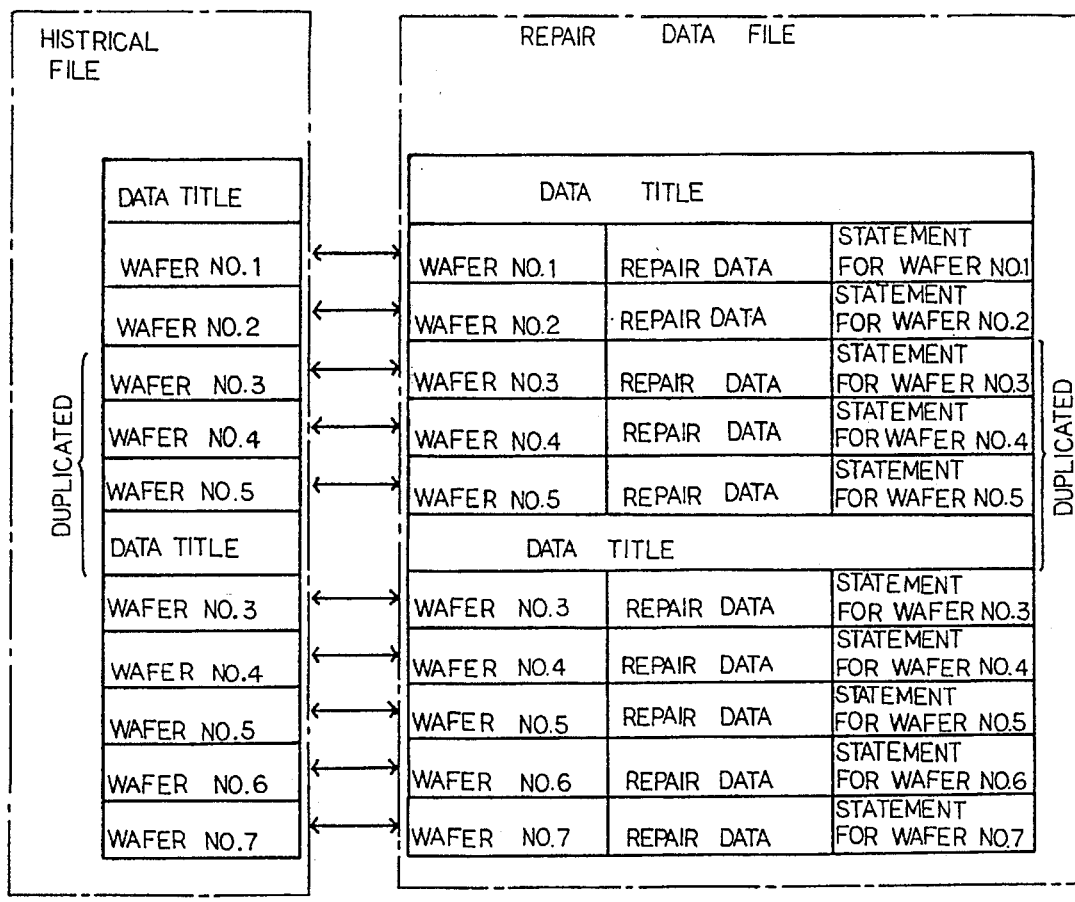
FIG. 13 is a view showing the organization of a repair data file and a historical file created through the test sequence shown in FIG. 12.

Upon completion of step S75, if trouble takes place, the wafer prober 22b discriminates the lot end interruption as by step S76. The wafer prober 22b supplies the wafer end signal to the tester 22a, and the writes the wafer number in the historical file (see steps S53 and S54 in FIG. 10). The wafer numbers are registered from the first to fifth in the historical file, and the repair data are stored for the first semiconductor wafer WF to the fifth semiconductor wafer WF as shown in FIG. 13.

The operator troubleshoots, and the repairing system restarts as by step S77.

The automatic handler 22m loads the third semiconductor wafer WF to the probe unit as by step S78, and the tester 22a carries out the test sequence for the third semiconductor wafer WF in cooperation with the wafer prober 22b. The tester 22a firstly writes the data title (see step S24 in FIG. 9) again. Thereafter, the tester 22a stores repair data for the third semiconductor wafer WF in the repair data file, and the wafer prober 22b registers the wafer number of the third semiconductor wafer WF in the historical file as by step S79. The tester 22a finally adds the statement after the repair data as by step S80.

Subsequently, the automatic handler 22m loads the fourth semiconductor wafer WF to the probe unit as by step S81, and the tester 22a carries out the test sequence for the second semiconductor wafer WF in cooperation with the wafer prober 22b. The tester 22a stores repair data for the fourth semiconductor wafer WF in the repair data file, and the wafer prober 22b registers the wafer number of the fourth semiconductor wafer WF in the historical file as by step S82. The tester 22a finally adds the statement after the repair data as by step S83.

After step S83, the automatic handler 22m loads the fifth semiconductor wafer WF to the probe unit as by step S84, and the tester 22a carries out the test sequence for the fifth semiconductor wafer WF in cooperation with the wafer prober 22b. The tester 22a stores repair data for the fifth semiconductor wafer WF in the repair data file, and the wafer prober 22b registers the wafer number of the fifth semiconductor wafer WF in the historical file as by step S85. The tester 22a finally adds the statement after the repair data as by step S86.

Subsequently, the automatic handler 22m loads the sixth semiconductor wafer WF to the probe unit as by step S87, and the tester 22a carries out the test sequence for the sixth semiconductor wafer WF in cooperation with the wafer prober 22b. The tester 22a stores repair data for the sixth semiconductor wafer WF in the repair data file, and the wafer prober 22b registers the wafer number of the sixth semiconductor wafer WF in the historical file as by step S88. The tester 22a finally adds the statement after the repair data as by step S89.

Finally, the automatic handler 22m loads the seventh semiconductor wafer WF to the probe unit as by step S90, and the tester 22a carries out the test sequence for the seventh semiconductor wafer WF in cooperation with the wafer prober 22b. The tester 22a stores repair data for the seventh semiconductor wafer WF in the repair data file, and the wafer prober 22b registers the wafer number of the seventh semiconductor wafer WF in the historical file as by step S91. The tester 22a finally adds the statement after the repair data as by step S92.

Thus, the repairing system repeats the test sequence for the first to seventh semiconductor wafers WF, and creates the repair data file and the historical file. As shown in FIG. 13, the third to fifth wafer numbers and the data title are duplicated in the historical file due to the trouble, and the trouble causes the repair data for the third to fifth semiconductor wafers WF and the data title to be duplicated in the repair data file.

Upon completion of the repair data file and the historical file, the tester 22a and the wafer prober 22b transfer the repair data file and the historical file through the cable network 24 to the host computer sub-system 21, and the host computer sub-system 21 edits the repair data file as by step S93.

When the editing work is finished, the host computer sub-system 21 transfers the repair data file to the laser trimming sub-system 23 as by step S94, and the laser trimming sub-system 23 selectively breaks the fuse elements of the defective semiconductor memories MM of the first to seventh semiconductor wafers WF for replacement of the defective memory cells with the redundant memory cells as by step S95. The repairing system confirms the repaired semiconductor memories MM to correctly behave as by step S96, and terminates the test/repair works.

Figure 14A:
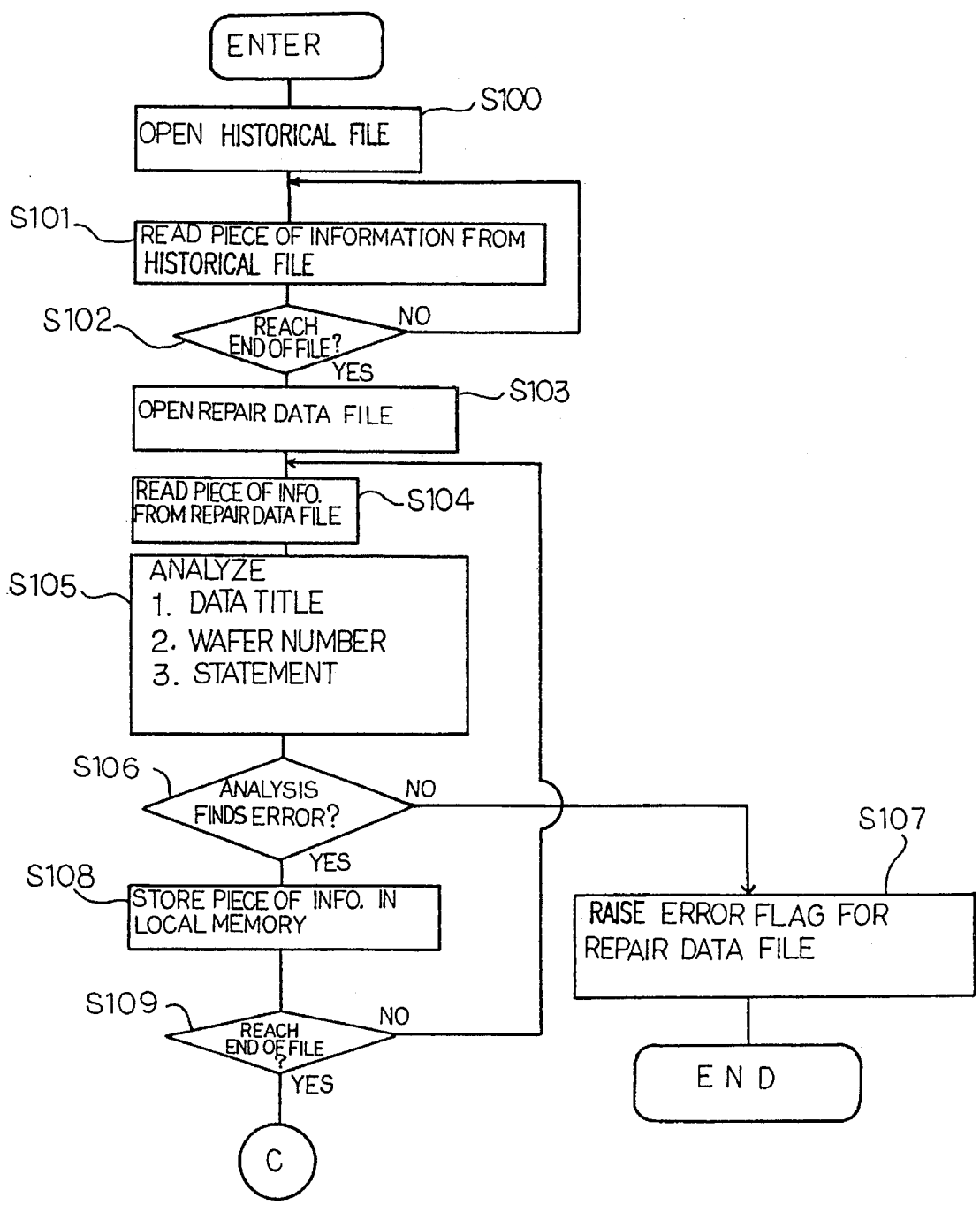
FIGS. 14A and 14B are flow charts showing a editing sequence carried out by a host computer sub-system incorporated in the repairing system.
Figure 14B:
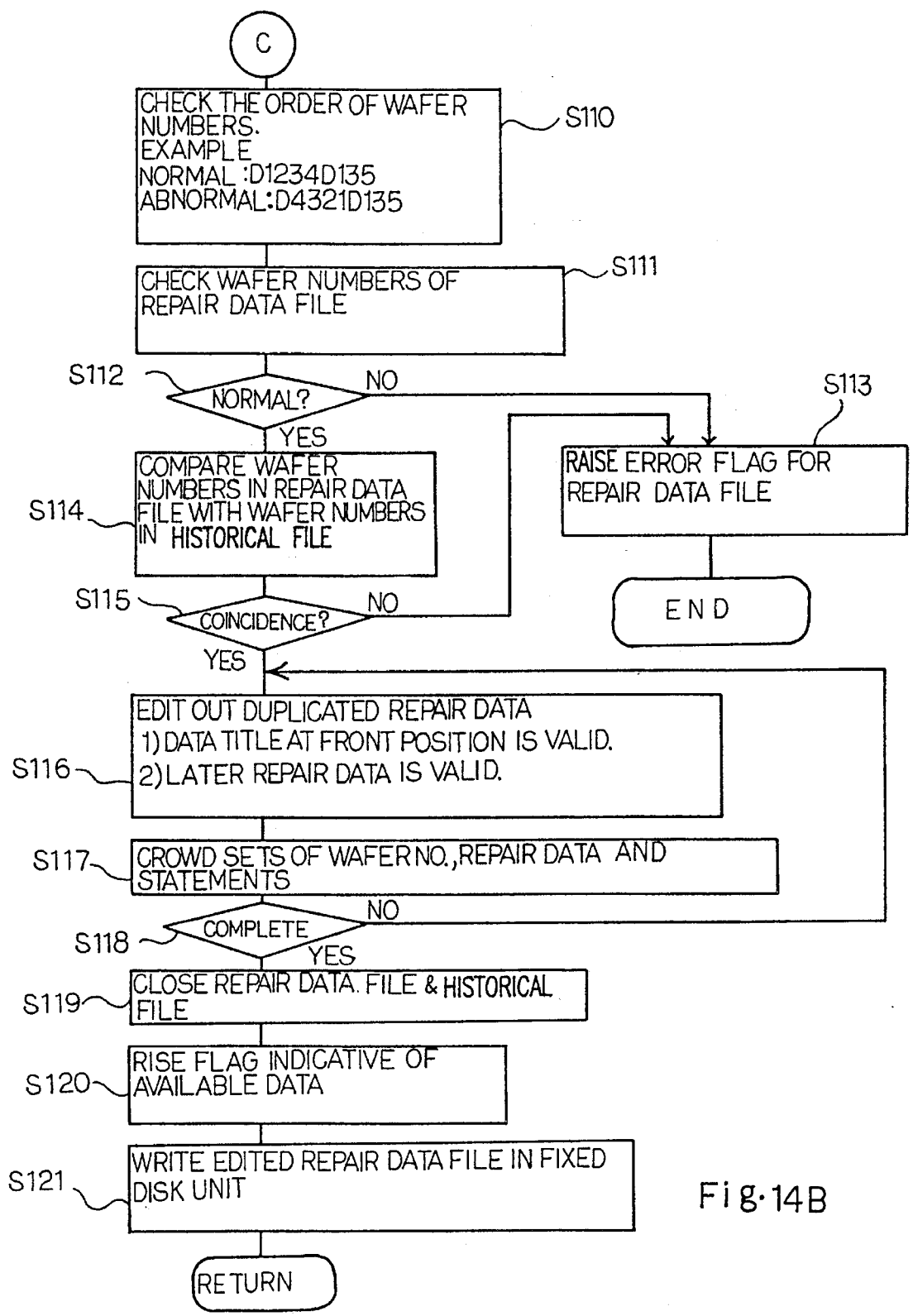

Turning to FIGS. 14A and 14B of the drawings, the host computer unit 21a sequentially executes the program sequence for editing the repair data file. Namely, the host computer unit 21a opens the historical file in the fixed disk unit 21i to the local memory 21h as by step S100, and reads a first piece of information stored in the historical file as by step S101. The piece of information is indicative of the data title or the wafer number.

The host computer unit 21a checks the piece of information read out from the historical file to see whether or not the all of the pieces of information stored therein are read out from the fixed disk unit 21i as by step S102, and stores the pieces of information in the local memory 21h.

While the answer to step S102 is given negative, the host computer unit 21a returns to step S101, and reiterates the loop consisting of steps 101 and 102. If the answer to step S102 is changed to affirmative, the host computer unit 21a opens the repair data file in the fixed disk unit 21i as by step S103.

The host computer unit 21a reads a first piece of information stored in the repair data file as by step S104, and analyzes the first piece of information as by step S105. In this instance, the piece of information stored in the repair data file is indicative of the data title or a set of the wafer number, the associated repair data and the statement after the repair data. In the analysis, the host computer unit 21a checks whether or not there is the data title in the repair data file, whether or not the wafer number is placed at the front position of the set and whether or not the statement is placed after the repair data.

If the first piece of information does not indicate the data title, the answer to step S106 is given negative, and the host computer unit 21a acknowledges an error, and provides an error flag to the repair data file as by step S107. In this situation, the host computer unit 21a stops the editing work, and informs the operator 26 of the occurrence of the error.

On the other hand, if the first piece of information is indicative of the data title, the answer to step S106 is given affirmative, and the host computer unit 21a stores the first piece of information in the local memory 21h as by step S108.

If all of the pieces of information have not been read out from the repair data file, the answer to step S109 is given negative, and the host computer unit 21a returns to step S104 for reading out the next piece of information. Thus, the host computer unit 21a reiterates the loop consisting of steps S104, S105, S106, S108 and S109 until all of the pieces of information are examined and stored in the local memory 21h. In the loop, if the wafer number is not placed at the front position or the set is incomplete without the statement, the host computer unit 21a proceeds to step S107, and terminates the editing work.

When the answer to step S109 is given affirmative, the historical file and the repair data file are stored in the local memory 21h, and the host computer unit 21a checks the order of the wafer numbers in the historical file as by step S110. For example, the pieces of information are arranged as "D1234D135" where "D" is the data title and the numerals are the wafer numbers, the interruption takes place after the diagnosis for the first to fourth semiconductor wafers WF, and the test sub-system 22 restarts the test sequence for the first, third and fifth semiconductor wafers WF. The wafer number is increased before and after the interruption, and the host computer unit 21a determines that the test sequence is normally carried out. On the other hand, if the pieces of information are arranged as "D4321D135", the wafer number is decreased until the interruption, and is increased after the interruption. The host computer unit 21a decides that the historical data is abnormal.

The host computer unit 21a further checks the repair data file to see whether the order of the wafer numbers is normal or abnormal as by step S111, and compares the wafer numbers in the repair data file are compared with the wafer numbers in the historical file. If they match, the host computer unit 21a decides that the order in the repair data file is normal. On the other hand, if they do not match, the host computer unit 21a determines that the order is abnormal.

If the abnormal is found, the answer to step S112 is given negative, and the host computer unit 21a rises the error flag as by step S113, and terminates the editing work.

On the other hand, the checks at steps S110 and S111 result in normal, the host computer unit 21a successively compares the wafer numbers in the repair data file with the wafer numbers in the historical file to see whether they are coincidence with one another as by step S114. If at least one of the wafer numbers in the repair data file is different from the corresponding wafer number in the historical data file, the answer to step S115 is given negative, and the host computer unit 21a proceeds to step S113 for terminating the editing work. If the repair data file and the historical file list the wafer numbers as "D12345D34567" and "D1234D34567", the host computer unit 21a terminates the editing work.

If the wafer numbers in the repair data file are coincident with the corresponding wafer numbers in the historical file, the answer to step S115 is given affirmative, and the host computer unit 21a edits out duplicated repair data as by step S116. The repair data file shown in FIG. 13 is valid, because both repair data and historical files list the waver numbers as "D12345D34567".

In the editing work at step S116, the data title at the front position in the repair data file is valid, and the later data title is deleted from the repair data file. On the other hand, the later set of the wafer number, the repair data and the statement is valid, and the former set is deleted from the repair data file.

When a set of the wafer number, the repair data and the statement is deleted from the repair data file, the host computer unit 21a crowds the remaining sets in the repair data file.

While the host computer unit 21a is editing out the duplicated sets of the wafer numbers, the repair data and the statements through steps S116 and S117, the answer to step S118 is given negative.

However, when the editing work is completed, the answer to step S118 is given affirmative, and the host computer closes the repair data file and the historical file as by step S119. The host computer unit 21a raises a flag indicative of available data as by step S120, and writes the edited repair data file in the fixed disk unit 21i as by step S121.

In this instance, the editing system 25 is implemented by the data processing units 22c and 22d for carrying out the program sequences shown in FIGS. 8A, 8B, 9, 10, 12A and 12B, the host computer unit 21a for carrying out the program sequence shown in FIGS. 14A and 14B and the cable network 24.

As will be appreciated from the foregoing description, the editing system edits the repair data file in accordance with the historical file without manipulation of an operator, and an error is rarely contained in the edited repair data file. As a result, the production yield is increased. Moreover, the editing system 25 quickly edits the repair data file, and the manufacturer can delivers guaranteed products to a customer within a shorter time period.

Second Embodiment

Figure 15:
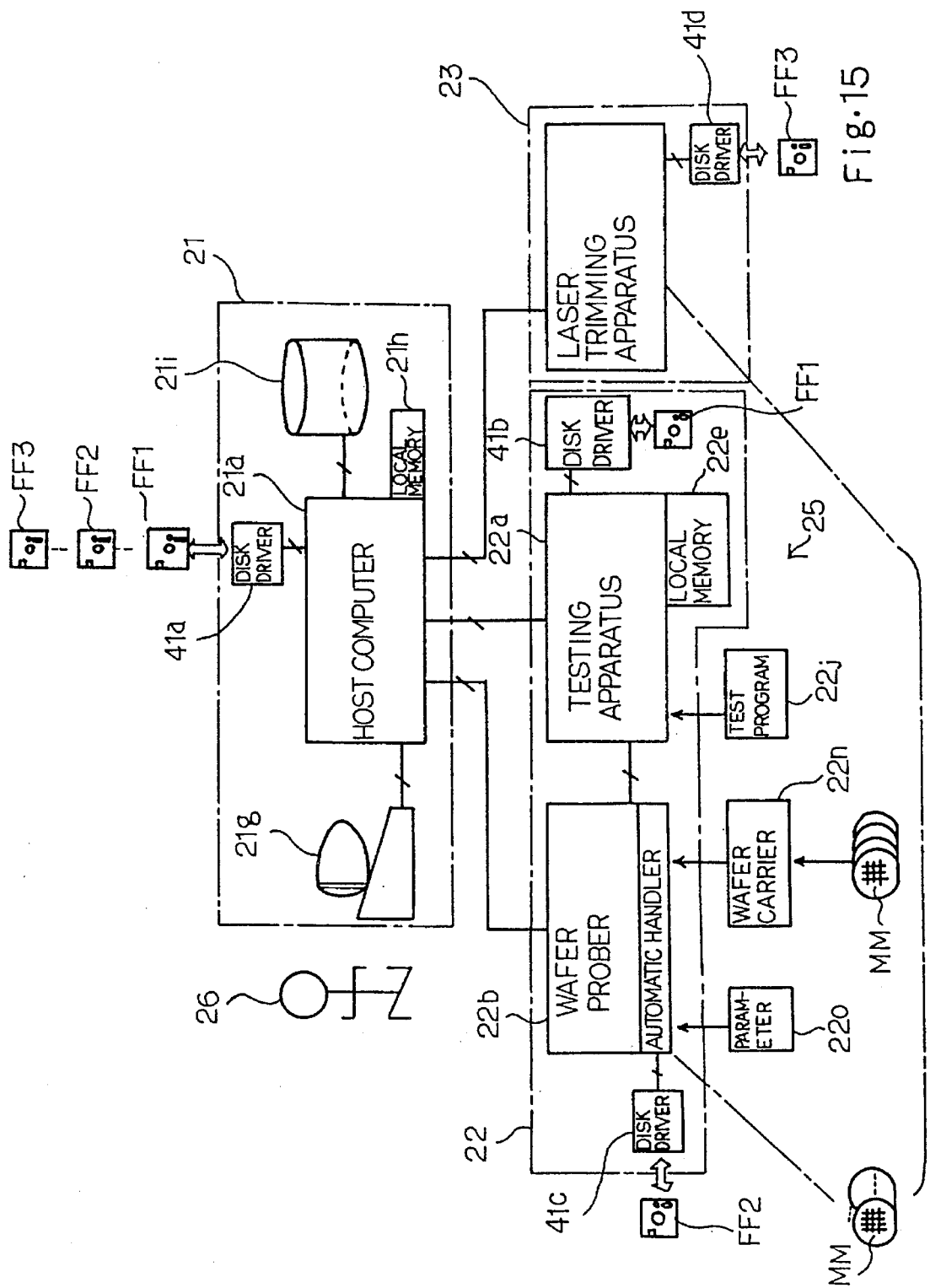
FIG. 15 is a schematic view showing another repairing system for semiconductor memory devices according to the present invention.

Turning to FIG. 15 of the drawings, another repairing system with an editing system embodying the present invention is illustrated, and the second embodiment is similar to the first embodiment except for file transfer between the test sub-system and the host computer sub-system. For this reason, description is focused on facilities used for the different file transfer, and the other components are labeled with the same references as the corresponding components of the first embodiment without detailed description.

Disk driver units 41a, 41b, 41c and 41d are respectively provided for the host computer unit 21a, the tester 22a, the wafer prober 22b and the laser trimming apparatus 23, and are under the control of the microprocessors incorporated in these apparatus 21a, 22a, 22b and 23. The operator inserts portable non-volatile information carrying media such as floppy disks FF1, FF2 and FF3 into the disk driver units 41a to 41d for duplicating a repair data file, a historical file and a edited repair data file.

In detail, when the tester 22a and the wafer prober 22b complete the repair data file and the historical file through the program sequences as similar to those of the first embodiment, the operator inserts the floppy disks FF1 and FF2 into the disk driver units 41b and 41c, and the microprocessors incorporated in the tester 22a and the wafer prover 22b duplicate the repair data file and the historical file into the floppy disks FF1 and FF2.

The operator takes out the floppy disks FF1 and FF2 from the disk driver units 41b and 41c, and conveys them to the host computer sub-system 21. The floppy disks FF1 and FF2 are successively inserted into the disk driver unit 41a, and the host computer unit 21a duplicates the repair data file and the historical file into the fixed disk unit 21i.

The host computer unit 21a edits the repair data file through the program sequence shown in FIGS. 14A and 14B, and the operator instructs the host computer unit 21a to duplicate the edited repair data file into the floppy disk FF3. The host computer unit 21a controls the disk driver unit 41a, and duplicates the edited repair data file into the floppy disk FF3.

The operator conveys the floppy disk driver to the laser trimming sub-system 23, and inserts the floppy disk FF3 into the disk driver unit 41d. The microprocessor incorporated in the laser trimming sub-system 23 duplicates the edited repair data file into a memory (not shown), and the laser trimming sub-system 23 carries out the repair work in accordance with the edited repair data file.

In this instance, the editing system 25 is implemented by the data processing units of the tester 22a and the wafer prober 22b for carrying out the program sequences shown in FIGS. 8A, 8B, 9, 10, 12A and 12B, the host computer unit 21a for carrying out the program sequence shown in FIGS. 14A and 14B and the disk driver units 41a to 41c for the floppy disks FF1 and FF2.

The disk driver units 41a to 41d can be additionally installed in the repairing system, and the prior art repairing system is easily remodeled into the repairing system according to the present invention. The advantages of the first embodiment are also achieved by the repairing system implementing the second embodiment.

Although particular embodiments of the present invention have been shown and described, it will be obvious to those skilled in the art that various changes and modifications may be made without departing from the spirit and scope of the present invention. For example, the editing system according to the present invention is available for any type of semiconductor integrated circuit fabricated on a semiconductor wafer.

What is claimed is:

1. An automatic repair data editing system associated with a repairing system for rescuing at least one semiconductor integrated circuit fabricated on each of semiconductor wafers from a rejection through a test sequence and a repairing sequence, comprising:

historical data producing means for creating a historical file listing pieces of first identity data indicative of said semiconductor wafers successively subjected to said test sequence in an orderly way;

repair data producing means for performing said test sequence for each semiconductor integrated circuit fabricated on said semiconductor wafers and for producing pieces of repair data used for rescuing defective semiconductor integrated circuits contained in said semiconductor integrated circuits, said pieces of repair data being respectively accompanied with pieces of second identity data indicative of the semiconductor wafers being successively subjected to said test sequence; and editing means for comparing said pieces of second identity data with said pieces of first identity data to determine if said pieces of repair data contain duplicate pieces of said pieces of repair data, said editing means deleting said duplicate pieces from said pieces of repair data for correcting said pieces of repair data when said pieces of second identity data are different in order from said pieces of first identity data, said defective semiconductor integrated circuits being automatically repaired through said repairing sequence in accordance with said repair data corrected by said editing means.

2. The automatic repair data editing system as set forth in claim 1, wherein said editing means checks said pieces of second identity data to determine if at least one of said pieces of second identity data is identical with others of said pieces of second identity data for editing out said others of said pieces of second identity data together with the pieces of repair data associated with said others of said pieces of second identity data.

3. The automatic repair data editing system as set forth in claim 1, wherein said historical data producing means comprises:

a wafer prober sequentially connected to said semiconductor integrated circuit on said semiconductor wafers for creating said historical file, for applying test patterns to each said semiconductor integrated circuit for carrying out said test sequence and for receiving test results produced from said test patterns applied to the semiconductor integrated circuit.

4. The automatic repair data editing system as set forth in claim 1, wherein:

said historical data producing means comprises a wafer prober sequentially connected to said semiconductor integrated circuit on said semiconductor wafers for creating said historical file, for applying test patterns to each said semiconductor integrated circuit for carrying out said test sequence and for receiving test results produced from said test patterns applied to the semiconductor integrated circuit, said repair data producing means comprising a tester for producing said repair data file from said results supplied from said wafer prober.

5. The automatic repair data editing system as set forth in claim 1, wherein said historical data producing means comprises a wafer prober sequentially connected to said semiconductor integrated circuit on said semiconductor wafers for creating said historical file, for applying test patterns to each said semiconductor integrated circuit for carrying out said test sequence and for receiving test results produced from said test patterns applied to the semiconductor integrated circuit, said repair data producing means comprising a tester for producing said repair data file from said results supplied from said wafer prober, wherein said editing means checks said pieces of second identity data to determine if at least one of said pieces of second identity data is identical with others of said pieces of second identity data for editing out said others of said pieces of second identity data together with the pieces of repair data associated with said others of said pieces of second identity data.

6. The automatic repair data editing system as set forth in claim 1, wherein said historical data producing means and said repair data producing means are connected through a cable network with said editing means for transferring said pieces of first identity data and said pieces of repair data accompanied with said pieces of second identity data to said editing means.

7. The automatic repair data editing system as set forth in claim 1, further comprising an information storage means, wherein said historical data producing means, said repair data producing means and said editing means respectively have a first disk driver unit, a second disk driver unit and a third disk driver unit, said first and second disk driver unit transferring said pieces of first identity data and said pieces of repair data accompanied with said pieces of second identity data to said information storage means, said information storage means supplying said pieces of first identity data and said pieces of repair data accompanied with said pieces of second identity data through said third disk driver unit to said editing means.

8. The automatic repair data editing system as set forth in claim 1, wherein said historical data producing means and said repair data producing means are connected through a cable network.

9. The automatic repair data editing system as set forth in claim 8, wherein said editing means transfers said pieces of first identity data, said pieces of repair data and said pieces of second identity data to said editing means.

10. The automatic repair data editing system as set forth in claim 1, wherein said historical data producing means, said repair data producing means and said editing means respectively have a first disk driver unit, a second disk driver unit and a third disk driver unit.

11. The automatic repair data editing system as set forth in claim 10, further comprising information storage means, wherein said first and second disk driver units transfer said pieces of first identity data, said pieces of repair data and said pieces of second identity data to said information storage means.

12. The automatic repair data editing system as set forth in claim 11, wherein said information storage means supplies said pieces of first identity data, said pieces of repair data and said pieces of second identity data through said third disk driver unit to said editing means.

13. The automatic repair data editing system as set forth in claim 1, further comprising retesting means for retesting said semiconductor integrated circuit after said semiconductor integrated circuit is repaired.

14. An automatic repair data editing system associated with a system for repairing at least one semiconductor integrated circuit fabricated on semiconductor wafers, comprising:

historical data producing means for creating a historical file listing first identity data indicative of a first order of said semiconductor wafers;

repair data producing means for testing each said semiconductor integrated circuit and for producing repair data for repairing defective semiconductor integrated circuits of said semiconductor integrated circuit, said repair data including second identity data indicative of a second order of said semiconductor wafers being successively tested; and editing means for comparing said second identity data with said historical data to determine if said repair data contain duplicate data, said editing means deleting said duplicate data when said first order is inconsistent with said second order.

15. An automatic repair data editing system associated with a system for repairing at least one semiconductor integrated circuit fabricated on semiconductor wafers, comprising:

historical data producing means for creating a historical file listing first identity data indicative of a first order of said semiconductor wafers, said first order having an ending value;

repair data producing means for testing each said semiconductor integrated circuit and for producing repair data for repairing defective semiconductor integrated circuits of said semiconductor integrated circuit, said repair data including second identity data indicative of a second order of said semiconductor wafers being successively tested, said second order having a beginning value; and editing means for comparing said second identity data with said historical data to determine if said repair data contain duplicate data, said editing means deleting said duplicate data when said ending value is equal to or greater than said beginning value.

16. An automatic repair data editing system associated with a system for repairing at least one semiconductor integrated circuit fabricated on semiconductor wafers, comprising:

historical data producing means for creating a historical file listing first identity data indicative of a first order of said semiconductor wafers;

repair data producing means for testing each said semiconductor integrated circuit and for producing repair data for repairing defective semiconductor integrated circuits of said semiconductor integrated circuit, said repair data including second identity data indicative of a second order of said semiconductor wafers being successively tested; and editing means for comparing said second identity data with said historical data to determine if said repair data contain duplicate data, said editing means deleting said repair data corresponding to second identity data that is equal to other second identity data.

* * * * *